(12) United States Patent
Hamamoto

(10) Patent No.: US 6,768,758 B1
(45) Date of Patent: Jul. 27, 2004

(54) SEMICONDUCTOR LASER, SEMICONDUCTOR OPTICAL AMPLIFIER, AND PRODUCTION METHOD THEREOF

(75) Inventor: Kiichi Hamamoto, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/570,287

(22) Filed: May 12, 2000

(30) Foreign Application Priority Data

May 13, 1999 (JP) .......................................... 11-132798

(51) Int. Cl.[7] ................................................. H01S 5/00

(52) U.S. Cl. .......................................... 372/46; 372/45

(58) Field of Search .............................. 372/45–50, 43, 372/44; 385/43

(56) References Cited

U.S. PATENT DOCUMENTS

| | | | | |
|---|---|---|---|---|
| 4,689,797 A | | 8/1987 | Olshansky | 372/45 |
| 4,813,051 A | * | 3/1989 | Taneya et al. | 372/45 |
| 4,961,198 A | * | 10/1990 | Ishino et al. | 257/14 |
| 4,991,926 A | * | 2/1991 | Pavlath | 385/27 |
| 5,227,015 A | * | 7/1993 | Fujihara et al. | 438/40 |
| 5,250,462 A | * | 10/1993 | Sasaki et al. | 148/DIG. 26 |
| 5,284,791 A | * | 2/1994 | Sakata et al. | 148/DIG. 110 |

(List continued on next page.)

FOREIGN PATENT DOCUMENTS

| | | | | |
|---|---|---|---|---|
| EP | 0 814 547 A1 | | 12/1997 | H01S/3/18 |
| EP | 0898 346 | * | 2/1999 | H01S/3/085 |
| EP | 0 898 346 A1 | | 2/1999 | H01S/3/085 |
| EP | 0 898 348 A1 | | 2/1999 | H01S/3/25 |
| JP | 60-163486 | | 8/1985 | H01S/3/18 |
| JP | 63-293989 | | 11/1988 | H01S/3/18 |
| JP | 64-61084 | | 3/1989 | H01S/3/18 |
| JP | 7-235722 | | 9/1995 | H01S/3/18 |
| JP | 2545719 | | 8/1996 | H01S/3/18 |
| JP | 09-289354 | * | 4/1997 | H01S/3/18 |
| JP | 9-199782 | | 7/1997 | H01S/3/18 |
| JP | 2723045 | | 11/1997 | H01S/3/18 |
| JP | 9-289354 | | 11/1997 | H01S/3/18 |
| JP | 11-68241 | | 3/1999 | H01S/3/18 |
| JP | 11-68242 | * | 3/1999 | H01S/3/085 |

OTHER PUBLICATIONS

Chen et al. "Two section semiconductor optical amplifier as optical power equalizer with high output power", Optical Amplifiers and Their Applications, MC3, 1998, pp 39–42.

Sagawa et al, "High–power, highly reliable operation of InGaAs/InGaAsP 0.98um lasers with an exponential–shaped flared stripe", Electronics Letters, vol. 32 No. 24, 1996, pp 2277 –2279.

Mawst, et al, "Resonant self–aligned–stripe antiguided diode laser array", Applied Phys. Letters, 60 (6), 1992, pp 668–670.

*Primary Examiner*—Paul Ip
*Assistant Examiner*—Tuan Nguyen
(74) *Attorney, Agent, or Firm*—Hayes Soloway P.C.

(57) ABSTRACT

A semiconductor laser capable of realizing a regular single mode output and achieving a high gain and high output as well as improving the COD level and the spatial hole burning and not causing a mode conversion loss in principle is provided. The semiconductor laser has a single mode waveguide and a multi-mode waveguide. The multi-mode waveguide has a wider width than that of the single mode waveguide. The single mode waveguide provides a single mode to an oscillated light oscillated from an active light waveguide. While the multi-mode waveguide provides modes including a multi-mode to the oscillated light, the resulting output mode emits into regular single mode output because of the self-imaging effect of multimode interference. Further more, the semiconductor laser has a light output end constituted by an end of the multi-mode waveguide.

15 Claims, 25 Drawing Sheets

U.S. PATENT DOCUMENTS

| | | | | | |
|---|---|---|---|---|---|
| 5,379,354 | A | * | 1/1995 | Jenkins | 385/46 |
| 5,390,205 | A | * | 2/1995 | Mori et al. | 372/46 |
| 5,410,625 | A | * | 4/1995 | Jenkins et al. | 385/28 |
| 5,428,698 | A | * | 6/1995 | Jenkins et al. | 385/27 |
| 5,436,195 | A | * | 7/1995 | Kimura et al. | 117/902 |
| 5,475,776 | A | * | 12/1995 | Jenkins et al. | 385/146 |
| 5,580,818 | A | * | 12/1996 | Sakata | 117/90 |
| 5,640,474 | A | * | 6/1997 | Tayag | 385/43 |
| 5,652,812 | A | * | 7/1997 | Gurib et al. | 385/14 |
| 5,689,597 | A | * | 11/1997 | Besse | 385/39 |
| 5,706,304 | A | * | 1/1998 | Ohkura | 372/46 |
| 5,756,373 | A | * | 5/1998 | Sakata | 438/24 |
| 5,770,466 | A | * | 6/1998 | Sasaki et al. | 438/31 |
| 5,796,883 | A | * | 8/1998 | Hamamoto et al. | 372/50 |
| 5,862,288 | A | * | 1/1999 | Tayag et al. | 385/129 |
| 5,933,554 | A | * | 8/1999 | Leuthold et al. | 385/28 |
| 5,942,944 | A | * | 8/1999 | Paolella et al. | 330/286 |
| 6,396,984 | B1 | * | 5/2002 | Cho et al. | 385/43 |

* cited by examiner

1: SINGLE WAVEGUIDE
2: FIRST MULTI-MODE WAVEGUIDE
3: TAPERED WAVEGUIDE

SEMICONDUCTOR LASER, SEMICONDUCTOR OPTICAL AMPLIFIER, AND PRODUCTION METHOD THEREOF

BACKGROUND OF THE INVENTION

1. Field of the Invention

The present invention relates to a semiconductor laser, a semiconductor optical amplifier, and a production method thereof.

2. Description of the Related Art

Nowadays, the opto-electronic technology is used in various fields, e.g. information I/O systems such as compact disc applications, and optical telecommunication systems using optical fibers. As devices for supporting the opto-electronic technology, various semiconductor lasers have been developed. For example, semiconductor lasers operating at near infrared or visible light band have been developed for use with compact discs, and semiconductor lasers of long wavelength band have been developed for use with optical telecommunication systems.

As a type of the semiconductor laser, there is a waveguide type semiconductor laser. In general, when a waveguide type semiconductor laser is used for information transmission or as an optical fiber amplification excitation source, its waveguide is designed so as to satisfy a single mode condition or a quasi-mode condition.

In general, when a laser beam is used in multi mode, there arises a problem with the multi mode dispersion. When a signal light is coupled to an optical waveguide such as an optical fiber or to a lens, there arises a difficulty in coupling a signal light effectively. These problems can be eliminated by designing the waveguide as mentioned below.

In order to satisfy the aforementioned single mode condition, various semiconductor lasers have been developed. (For example, Japanese Patent Publication 63-293989 discloses such a semiconductor laser element.) However, the configuration designed to satisfy the single mode condition has restricted the laser characteristics.

For example, a width and a thickness of an active layer in a semiconductor laser have been limited within a predetermined range according to the single mode condition. Especially, in order to improve a gain saturation level, it is advantageous to enlarge the waveguide width. However, this is limited to a certain value because of the aforementioned single mode condition. Thus, semiconductor laser output power has been limited technically.

An example of eliminating such limitation by the single mode condition is disclosed in L. J. Mawst et al. "Phase-locked laser diode array", Applied Physics Letters Vol. 60, No. 6, 1992, pp. 668–670. In this phase-locked laser diode array, 20 semiconductor lasers of single mode are arranged at a predetermined interval in a direction vertical to the light waveguide, so that the semiconductor lasers produce resonance, thus enabling to finally obtain a high single mode output.

However, this phase-locked laser diode array has a complicated configuration, which results in a low production yield.

Moreover, when producing the phase-locked laser diode array so as to satisfy the resonance condition, the tolerance is very small and it is difficult to produce identical arrays.

Furthermore, in addition to the active layer gain saturation, COD (catastrophic optical damage) and spatial hole burning are known as phenomena constricting the semiconductor laser output. In general, in order to improve the COD level, it is preferable to enlarge the waveguide width so as to reduce the light density per unit area of the cleaved facet or end.

However, the waveguide width is under restriction of the single mode condition as is mentioned above. Furthermore, in order to suppress the spatial hole burning, in general, it is preferable to reduce the waveguide width. Thus, in order to obtain a high output in the conventional semiconductor laser, it is necessary to perform designing, satisfying the single mode condition and considering the COD level and the spatial hole burning which are in a trade off relationship with the single mode condition. Accordingly, it has been tremendously difficult to obtain a high output of a semiconductor laser.

As a method to improve the aforementioned COD level, 10 a semiconductor laser using a flare type waveguide is suggested by M. Sagawa et al., Electronics Letters, Vol. 32, No. 24, 1996, pp. 2277–2279. In this semiconductor laser of the flare type, the width of the waveguide is gradually increased from backward end toward the forward end, so as to reduce the light density at the light emitting surface while keeping the single mode light emission, thus enabling to improve the COD level and to obtain a high output.

However, the light propagating mode greatly depends on the flare configuration. The flare configuration cannot be easily reproduced for obtaining the single mode output. For example, if, during a production, a slight pattern error or waveguide unevenness is caused, it is difficult to obtain the lateral single mode output as is designed with a high yield, and multi mode oscillation may occur. Alternatively, the spatial hole burning, i.e., multi mode oscillation due to current flow-in may occur.

Moreover, because the cleaved end has a flare configuration, a high accuracy is required for the cleaving position and it has been difficult to obtain identical lateral single mode output.

Furthermore, in the aforementioned semiconductor laser, in principle, mode conversion is performed along the entire propagating direction and the mode conversion loss is inevitable. That is, it is extremely difficult to obtain a highly efficient output by the aforementioned semiconductor laser.

In addition to the aforementioned document, Japanese Patent Publication 9-199782, Japanese Patent No. 2545719, and Japanese Patent No. 2723945 suggest semiconductor lasers using a waveguide of the flare configuration. However, these semiconductor lasers have the same problems as has been described above.

With respect to a semiconductor optical amplifier, a tapered configuration is implemented to improve a saturated output level. This is reported by Chih-Hsiao Chen et al, "Technical Digest of Optical Amplifier and Applications", MC3, 1998, pp. 39–42. In this semiconductor optical amplifier, by implementing a wide region, so as to increase the active layer area compared to the conventional single mode waveguide, thus improving the saturated output level.

However, the light output mode greatly depends on the shape of the tapered configuration. The tapered configuration cannot be easily reproduced for obtaining the single mode output. For example, if, during a production, a slight pattern error or waveguide unevenness is caused, it is difficult to obtain the lateral single mode output as is designed with a high yield, and multi mode oscillation may occur. Alternatively, the spatial hole burning, i.e., multi mode oscillation due to current flow-in may occur.

Furthermore, the aforementioned semiconductor optical amplifier has a configuration that in principle, mode conversion is performed over all the waveguide directions and mode conversion loss is inevitable. Accordingly, it is quite difficult to obtain a highly efficient output by the aforementioned semiconductor optical amplifier.

As has been described above, the conventional single mode semiconductor laser has a problem that it is difficult to obtain a high output because of a gain saturation of the active layer due to the single mode condition, the spatial hole burning, the COD level, and the like.

Another conventional example, though solving these problems, has a problem of configuration complexity. The production condition tolerance is strict and reproducibility is very low. In principle, the mode is unstable and there is a problem of spatial hole burning. The efficiency is lowered by the mode conversion loss. Moreover, it is difficult to obtain a stable lateral mode.

These problems are also present in the conventional optical amplifier.

SUMMARY OF THE INVENTION

It is therefore an object of the present invention to provide a semiconductor laser and a semiconductor optical amplifier capable of realizing a single mode output, which is one of the important characteristics of a waveguide optical device, and obtaining a high gain and high output as well as improvement of the COD level and the spatial hole burning to obtain a stable lateral mode, and not generating a mode conversion loss in principle. Another object of the present invention is to provide a production method of such a semiconductor laser and a semiconductor optical amplifier.

In order to achieve the aforementioned object, the present invention in a first embodiment provides a semiconductor laser comprising: a single mode waveguide and a first multi-mode waveguide, wherein the first multi-mode waveguide has a greater width than the single mode waveguide, the single mode waveguide provides a single mode to an oscillated light oscillated from an active light waveguide, the first multi-mode waveguide provides modes including a multi-mode to the oscillated light, and the semiconductor laser has a light output port consisting of the first multi-mode waveguide.

In another embodiment of the invention, the single mode waveguide is, for example, connected to one of the light output ends of the first multi-mode waveguide.

In yet another embodiment of the invention, a tapered waveguide is connected between the single mode waveguide and the first multi-mode waveguide.

In a further embodiment of the invention, the first multi-mode waveguide may have one-port at one side and N-ports at the other side of it (N is a positive integer), i.e., 1 XN, multi-mode interference type waveguide. For example, the first multi-mode waveguide may be a one-input one-output, i.e., 1×1, multi-mode interference type waveguide.

A still further embodiment of the invention provides a semiconductor laser comprising: a single mode waveguide, a first multi-mode waveguide, and a second multi-mode waveguide, wherein the first multi-mode waveguide has a greater width than the single mode waveguide, the single mode waveguide provides a single mode to an oscillated light oscillated from an active light waveguide, the first and the second multi-mode waveguides provide modes including a multi-mode to the oscillated light, and the semiconductor laser has a light output end constituted by an end of the second multi-mode waveguide.

According to yet another embodiment of the invention, it is preferable that the second multi-mode waveguide be a secondary mode cleaved waveguide.

In an additional embodiment of the invention, the second multi-mode waveguide may be a one-input one-output, i.e., 1×1, multi-mode interference type waveguide.

A further embodiment of the invention provides a semiconductor laser production method comprising: a first step of successively forming on a substrate, a buffer layer, an active layer, and a first cladding layer, a second step of removing portions of the buffer layer, the active layer, the first cladding layer, and the substrate so as to form a mesa, a third step of successively forming a first current blocking layer and a second current blocking layer around the mesa in such a way that only the first current blocking layer is in contact with the side wall of the mesa and only the second current blocking layer is exposed outside, a fourth step of successively forming a second cladding layer and a cap layer to cover the first current blocking layer and the mesa, a fifth step of forming a rear electrode and a front electrode; and a sixth step of applying a half-reflection coating to one end of the waveguide and an anti-reflecting coating to the other end after an element is cleaved.

Yet another embodiment of the present invention provides a semiconductor optical amplifier comprising: a single mode waveguide, a first multi-mode waveguide, and a reflection preventing an end formed on both ends, wherein the first multi-mode waveguide has a greater width than the single mode waveguide, the single mode waveguide provides a single mode to an amplified light amplified by an active light waveguide, the first multi-mode waveguide provides modes including multi-mode to the amplified light, and the semiconductor optical amplifier has a light output end constituted by an end of the first multi-mode waveguide.

Still yet another embodiment of the invention provides a semiconductor optical amplifier comprising: a single mode waveguide, a first multi-mode waveguide, a second multi-mode waveguide, and anti-reflection ends formed on both ends, wherein the first multi-mode waveguide has a greater width than the single mode waveguide, the single mode waveguide provides a single mode to an oscillated light oscillated from an active light waveguide, the first and the second multi-mode waveguides provide modes including a multi-mode to the oscillated light, and the semiconductor optical amplifier has a light output end constituted by an end of the second multi-mode waveguide.

By applying a reflection preventive means such as an anti-reflection coating to the both ends of the semiconductor laser, it is possible to obtain a semiconductor optical amplifier. Accordingly, the semiconductor lasers of the present invention can be directly used as the semiconductor optical amplifiers.

A further embodiment of the present invention provides a semiconductor optical amplifier production method comprising: a first step of successively forming on a substrate, a buffer layer, an active layer, and a first cladding layer, a second step of removing portions of the buffer layer, the active layer, the first cladding layer, and the substrate so as to form a mesa, a third step of successively forming a first current blocking layer and a second current blocking layer around the mesa in such a way that only the first current blocking layer is in contact with the side wall of the mesa and only the second current blocking layer is exposed outside, a fourth step of successively forming a second cladding layer and a cap layer to cover the first current blocking layer and the mesa, a fifth step of forming a rear electrode and a front electrode; and a sixth step of applying an anti-reflecting coating to the ends after an element is cleaved.

DESCRIPTION OF THE PREFERRED EMBODIMENTS

[Embodiment 1]

Figure 1:
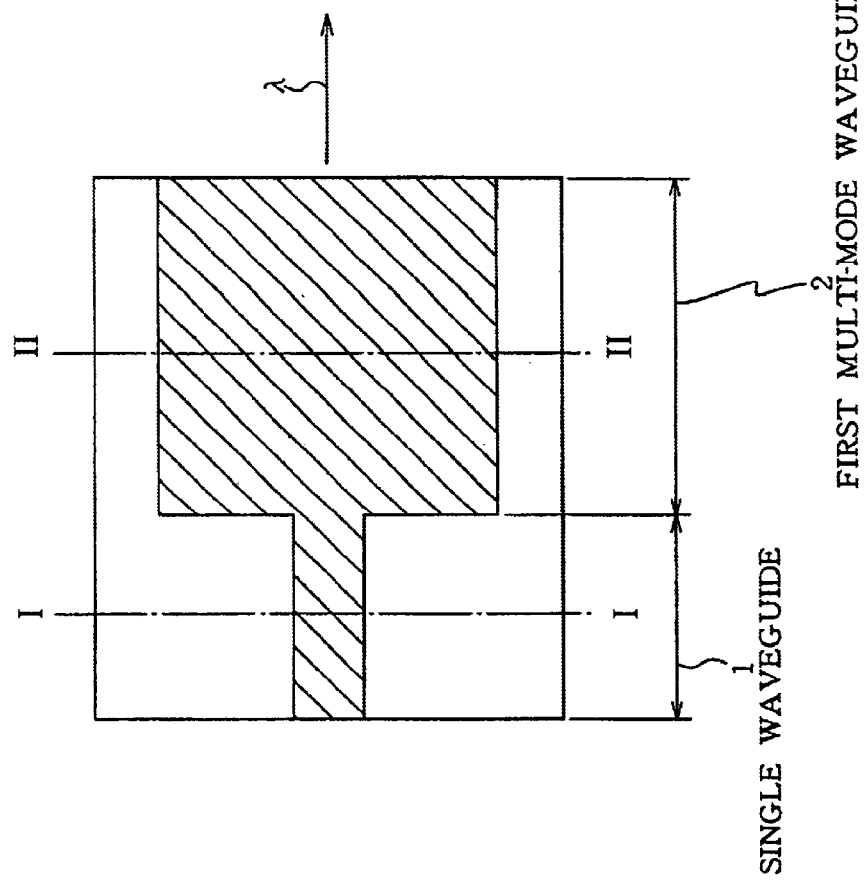
Figure 2:
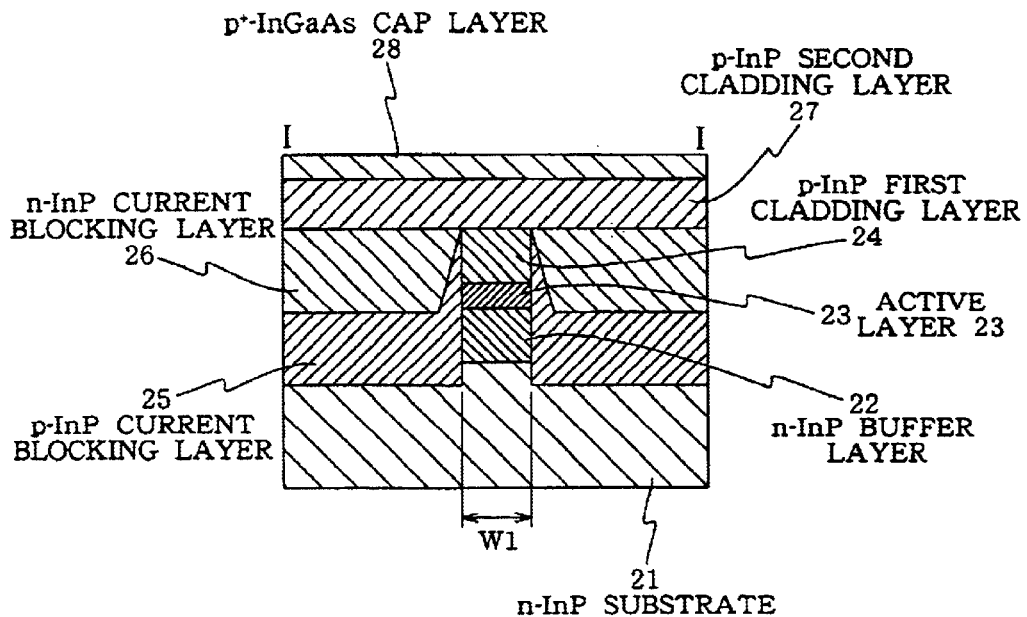
FIG. 2 is a cross sectional view about the line I—I in FIG. 1.
Figure 3:
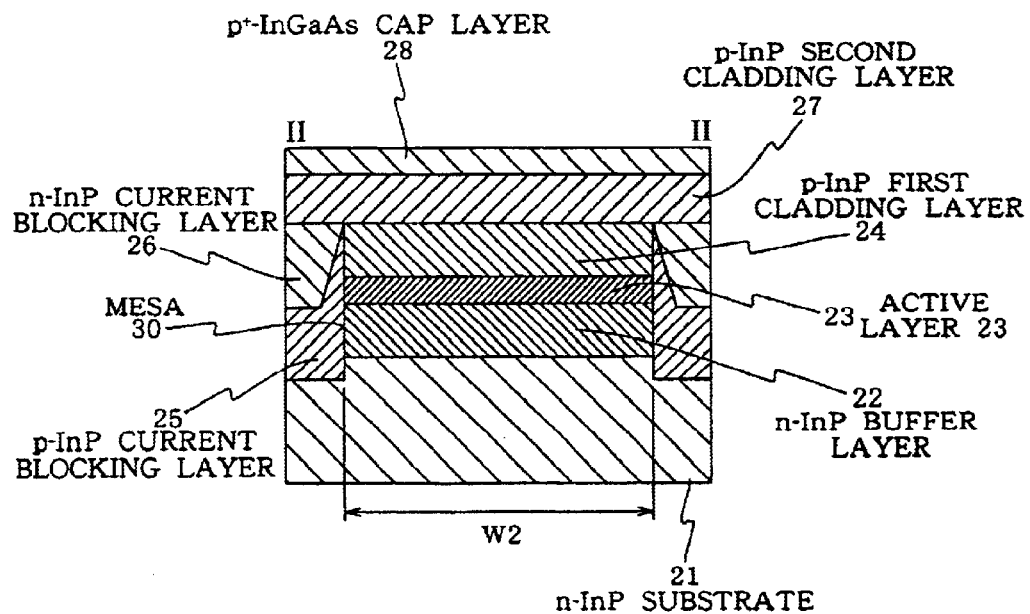
FIG. 3 is a cross sectional view about the line II—II in FIG. 1.

FIG. 1 to FIG. 3 show a semiconductor laser according to a first embodiment of the present invention. FIG. 1 is a plan view of the semiconductor laser, FIG. 2 is a cross sectional view about the line I—I in FIG. 1, and FIG. 3 is a cross sectional view about the line II—II in FIG. 1. This semiconductor laser is a buried-heterostructure (BH) semiconductor laser having 1.55-micrometer band.

As shown in FIG. 1, the semiconductor laser according to the present embodiment includes a first multi-mode waveguide 2 formed in a multi-mode waveguide region and a 5 single mode waveguide 1 formed in a single mode waveguide region and coupled to a light incident end of the first multi-mode waveguide 2.

The first multi-mode waveguide 2 formed in the multi-mode waveguide region is a multi-mode interference type waveguide having one input and one output (hereinafter, referred to as 1×1-MMI.).

As for the lengths of the respective regions, length of the single mode waveguide 1 is about 50 micrometers, and length of the first multi-mode waveguide 2 is about 260 micrometers. The entire length of the semiconductor laser is about 310 micrometers.

As shown in FIG. 2 and FIG. 3, the semiconductor laser according to the present embodiment includes: an n-InP substrate 21 having a protruded portion; an n-InP buffer layer 22, an active layer 23, and a p-InP first cladding layer 24 which are formed in a mesa shape on the protruded portion of the n-InP substrate 21; a p-InP current blocking layer 25 and an n-InP current blocking layer 26 which are formed around the mesa 30; and a p-InP second cladding layer 27 and a $p^+$-InGaAs cap layer 28 which are formed on the p-InP first cladding layer 24 and the n-InP current layer 26.

As shown in FIG. 2 and FIG. 3, the active layer 23 is made from 1.55-micrometer composition InGaAsP. The active layer 23 has a current confinement structure surrounded by the p-InP current blocking layer 25 and the n-InP current blocking layer 26, and is covered with the p-InP first cladding layer 24, the p-InP second cladding layer 27, and the $p^+$-InGaAs cap layer 28.

As shown in FIG. 2 and FIG. 3, the p-InP current blocking layer 25 and the n-InP current blocking layer 26 are formed in such a way that only the p-InP current blocking layer 25 is in contact with the side wall of the mesa 30 and only the n-InP current blocking layer 26 is in contact with the p-InP second cladding layer 27.

Comparison of FIG. 2 with FIG. 3 clarifies that the single mode waveguide 1 is different from the first multi-mode waveguide 2 in width of the waveguide. As shown in FIG. 2, the single mode waveguide 1 has a waveguide width (W1) set to W1=2 micrometers. Moreover, as shown in FIG. 3, the first multi-mode waveguide 2 has a waveguide width (W2) set to W2=10 micrometers.

Hereinafter, referring to FIG. 4 to FIG. 7, explanation will be given on a production method of the semiconductor laser according to the present embodiment.

Figure 4:
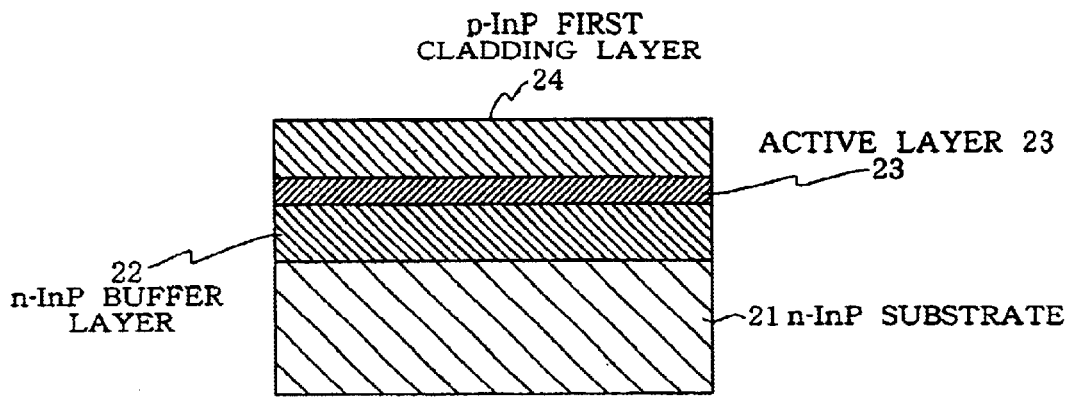

Firstly, as shown in FIG. 4, the n-InP substrate 21 is successively covered with the n-InP buffer layer 22, the active layer 23 made from 1.55-micrometer composition InGaAsP, and the p-InP first cladding layer 24, using the metal organic vapor phase epitaxy (MOVPE) technique. The respective layers have thickness values as follows: the n-InP buffer layer is set to about 100 nm, the 1.55-micrometer InGaAsP active layer 23 is set to about 100 nm, and the p-InP first cladding layer 24 is set to about 100 nm.

Next, the ordinary photolithography method and wet etching method are used to form a mesa-shaping mask 31 on the p-InP first cladding layer 24.

Figure 5:
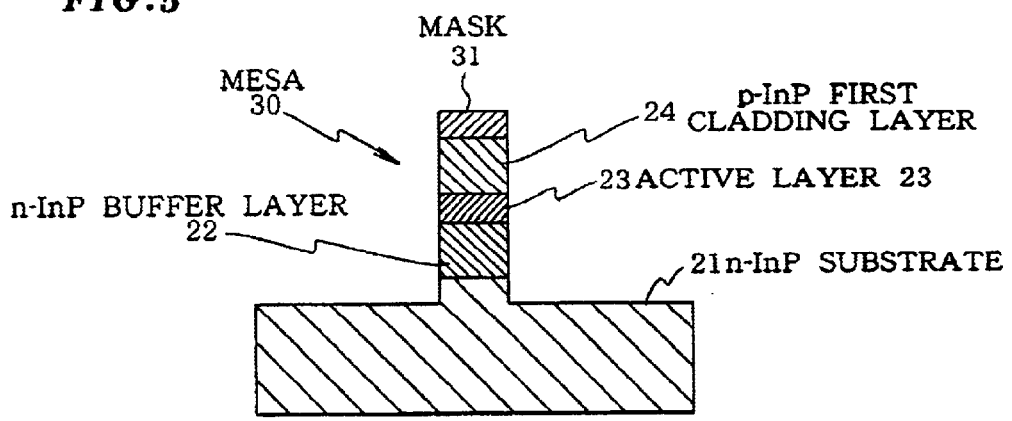

Next, as shown in FIG. 5, the reactive ion etching (RIE) 15 technique is used to remove a portion of the p-InP first cladding layer 24, the 1.55-micrometer InGaAsP active layer 23, the n-InP buffer layer 22, and the n-InP substrate 21, thus forming a mesa 30.

Figure 6:
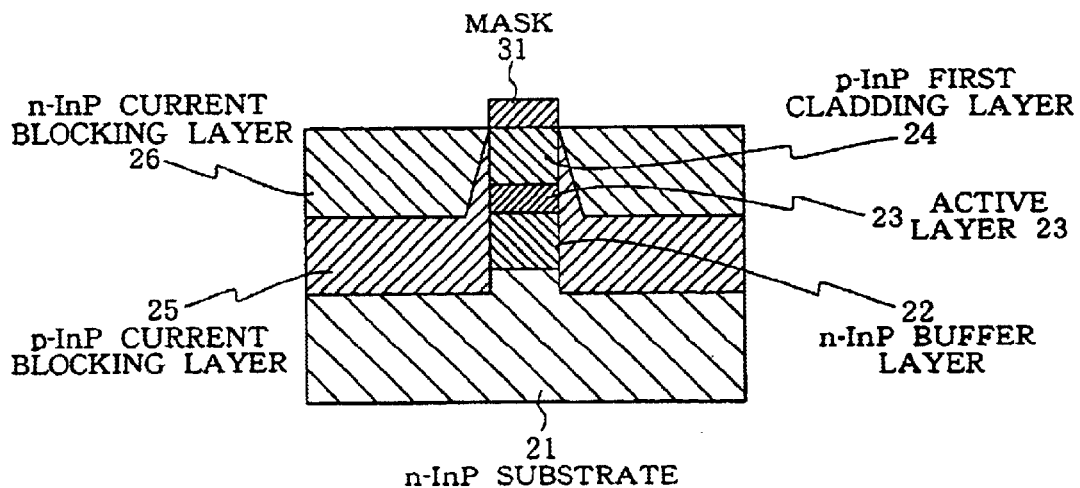

Next, as shown in FIG. 6, using the MOVPE technique, the p-InP current blocking layer 25 and the n-InP current blocking layer 26 are formed around the mesa 30. These current blocking layers 25 and 26 are formed in such a manner that only the p-InP current blocking layer 25 is in contact with the side wall of the mesa 30 and only the n-InP current blocking layer 26 is exposed outside.

Each of the p-InP current blocking layer 25 and the n-InP current blocking layer 26 has a thickness of about 1 micrometer.

Next, the mesa-shaping mask 31 is removed by buffered hydrofluoric acid.

Figure 7:
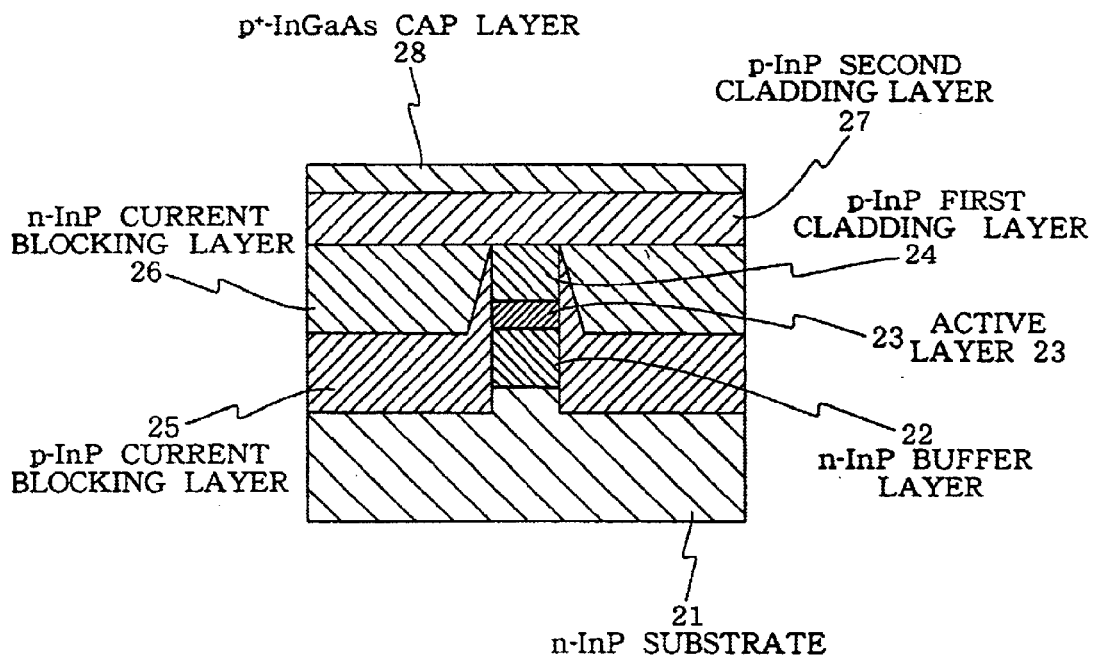

After this, as shown in FIG. 7, the p-InP first cladding layer 24 and the n-InP current blocking layer 26 are covered with the p-InP second cladding layer 27 and then with the p$^+$-InGaAs cap layer 28 using the MOVPE technique.

Next, the back surface of the n-InP substrate 21 is polished.

Next, a rear electrode and a front electrode are formed using the ordinary sputtering method.

After an element is cleaved, the cleaved end of the side of the single mode waveguide 1 is coated with an ordinary half reflection (HR) coating, and the cleaved end of the light emitting side is coated with an anti-reflective (AR) coating.

Thus, production procedure of the embodied semiconductor laser according to the present embodiment is completed.

The semiconductor laser according to the present embodiment is a laser oscillating a single mode, which can achieve a high output compared to a conventional single mode laser and improve the COD level. Furthermore the semiconductor laser according to the present embodiment can improve the spatial hole burning compared to a conventional laser having a multi-mode waveguide having a flare structure. Moreover, the semiconductor laser has an excellent mode stability and does not cause efficiency lowering due to a mode conversion loss. Hereinafter, explanation will be given on the principle explaining these merits.

The semiconductor laser according to the present embodiment, as shown in FIG. 1, is designed as 1×1-MMI. having the first multi-mode waveguide 2. That is, the first multi-mode waveguide 2 is a quasi-single mode waveguide in which only the single mode light propagates at the both ends in spite of the multi-mode waveguide.

Figure 8:
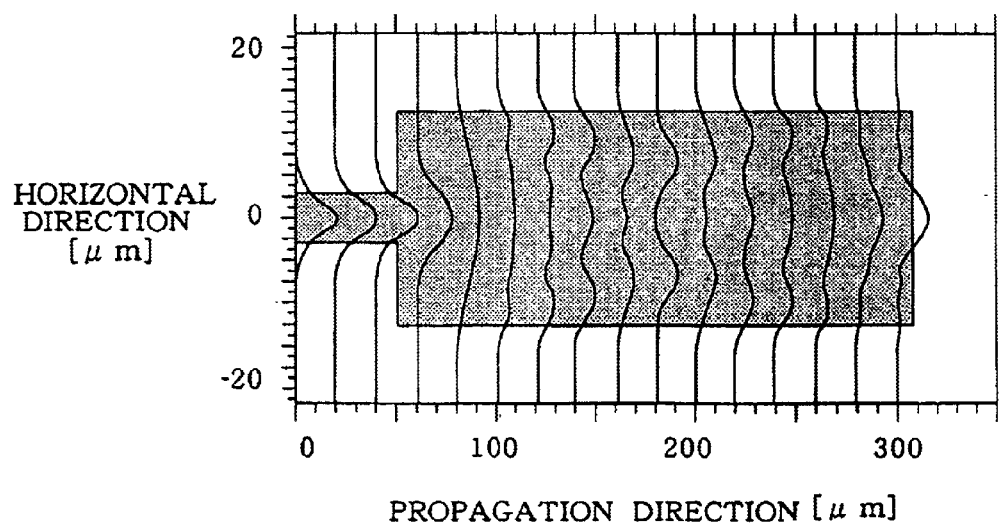
Figure 9:
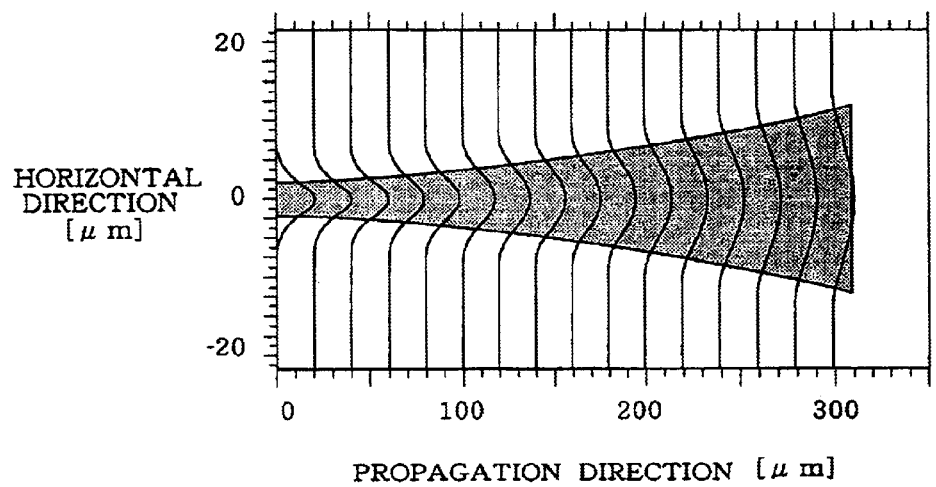

FIG. 8 and FIG. 9 show simulation results of configuration of the semiconductor laser according to the present embodiment using two-dimensional beam propagation technique. FIG. 8 shows a simulation result of the first multi-mode waveguide 2 having the 1×1-MMI. configuration in the semiconductor laser according to the present embodiment.

FIG. 9 shows, for comparison, a simulation result of a multi-mode waveguide having a conventional flare structure.

Referring to FIG. 8, single mode light which has propagated through the single mode waveguide 1 is introduced into multi-mode in the region of the first multi-mode waveguide 2 and again identically imaged as a single mode at the end of the first multi-mode waveguide 2.

On the other hand, referring to FIG. 9, in the conventional multi-mode waveguide having the flare structure, the mode conversion of the single mode itself is performed as the single mode light advances in the waveguide and the single mode is output at the end.

As shown in FIG. 8, if a regular single mode waveguide is coupled to one end of a multi-mode waveguide, oscillation is performed in a single mode even if the light output end is constituted by an end of the multi-mode waveguide.

In such oscillation, the first multi-mode waveguide 2 is a main pumping light region. This first multi-mode waveguide 2 is wider than the single mode waveguide 1 and accordingly, the active layer 23 has an improved gain saturation level compared to the ordinary single mode semiconductor laser. Thus, it is possible to achieve a high output.

Moreover, in the semiconductor laser according to the present embodiment, the light output end is also constituted by the wide first multi-mode waveguide 2.

Accordingly, in comparison to the ordinary single mode semiconductor laser, the light density is lowered at the light output end even if the same light intensity, which improves the COD level.

Furthermore, in the semiconductor laser according to the present embodiment, the output mode can be controlled independently by the single mode waveguide 1, and the multi-mode waveguide 2 formed as the 1×1-MMI. does not operate as 1×1-MMI. for odd modes according to the MMI. theory. That is, no odd modes are excited. Accordingly, the spatial hole burning is not easily caused in comparison to the conventional semiconductor laser utilizing the multi-mode waveguide having the flare shape as shown in FIG. 9. As a result, it is possible to realize a semiconductor laser having an excellent mode stability.

In addition to the aforementioned, the semiconductor laser according to the present embodiment uses the multi-mode waveguide 2 performing the MMI. operation and accordingly, no mode conversion loss is generated in principle.

Accordingly, the semiconductor laser according to the present embodiment does not cause efficiency lowering as is observed in the conventional semiconductor laser utilizing the flare structure.

Moreover, the layer configuration of the semiconductor laser according to the present embodiment is equivalent to the layer configuration of an ordinary semiconductor laser and can be produced by the ordinary semiconductor laser production procedure. That is, the semiconductor laser according to the present embodiment can be produced comparatively easily by the established production method with a high reproducibility and a high yield.

Moreover, the semiconductor laser of the present embodiment has a comparatively simple configuration and can easily be applied to an integrated optical device.

It should be noted that the present (first) embodiment and the following second to eighth embodiments are assumed to have a simple buried-heterostructure. However, the embodiments are not to be limited to the buried-heterostructure and can be applied to the other layer configuration such as ridge structure or double channel planner buried-heterostructure (DC-PBH) having an excellent current confinement.

Moreover, in the present embodiment, the laser wavelength is set to the 1.55-micrometer band but the laser wavelength is not to be limited to this value. For example, the laser wavelength may be in a visible light region or 0.98 micrometer band or other near infrared light band.

Furthermore, the active layer 23 in the present embodiment has a bulk structure, but the active layer 23 can also have a multiple quantum well (MQW) structure.

Moreover, with respect to the production method, in the present embodiment and the second to the eighth embodiments which will be detailed later, the MOVPE technique is used for crystal growth and the RIE technique is used for formation of the mesa 30. However, the production method is not to be limited to this. For example, the molecular beam epitaxy (MBE) method can be used for crystal growth and wet etching can be used for formation of the mesa 30.

[Embodiment 2]

Figure 10:
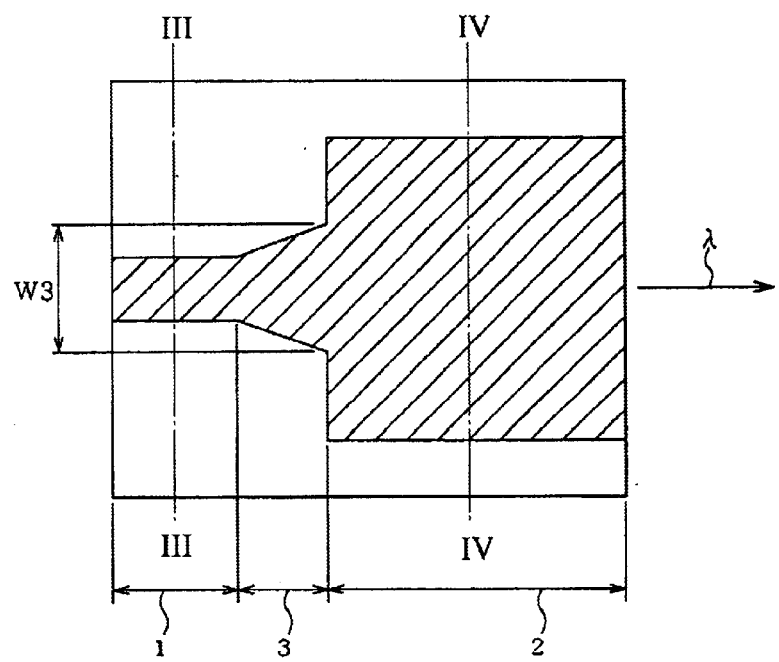
Figure 11:
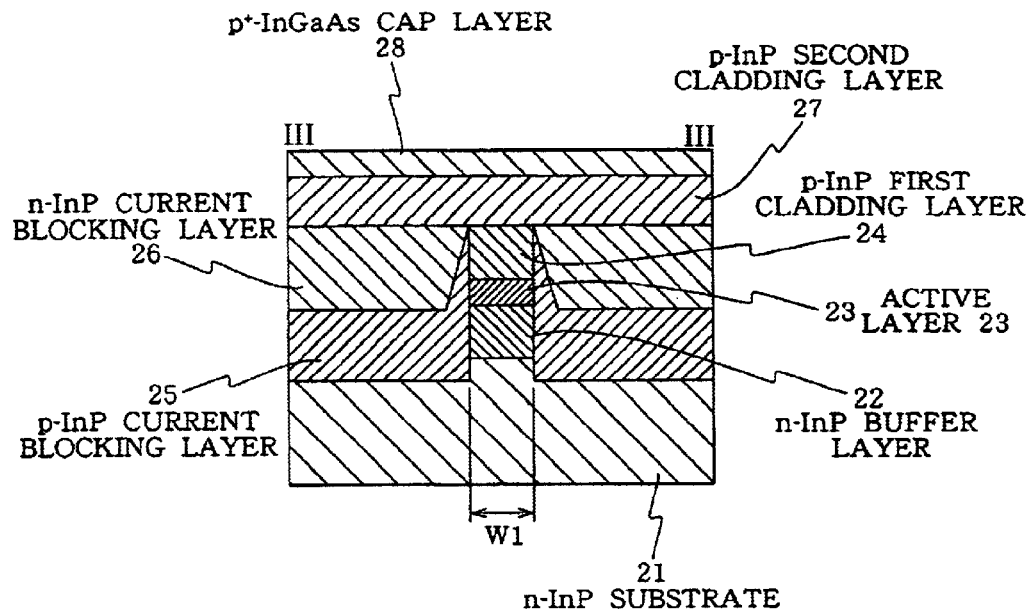
FIG. 11 is a cross sectional view about the line III—III in FIG. 10.
Figure 12:
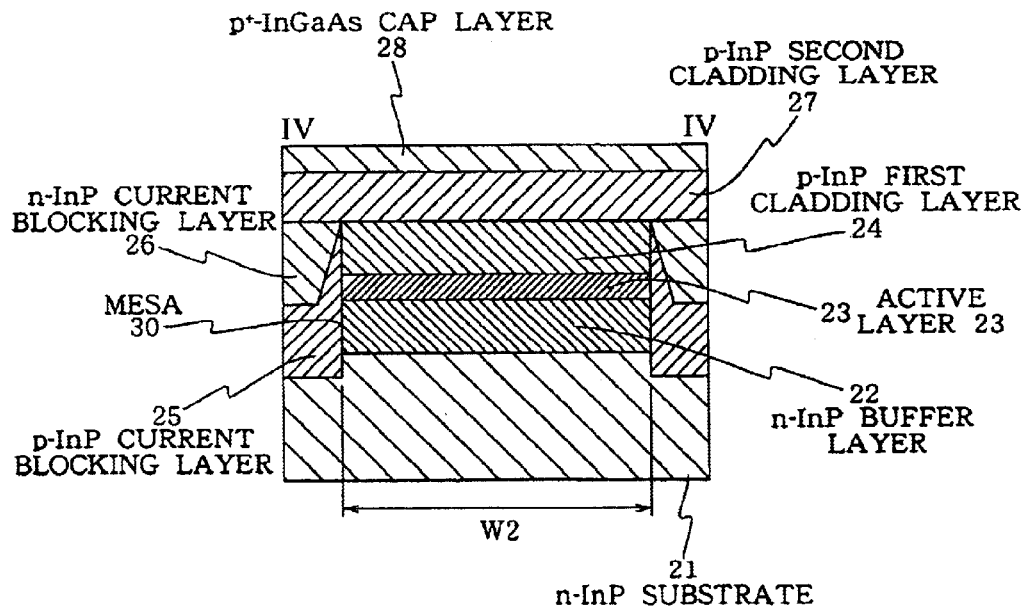
FIG. 12 is a cross sectional view about the line IV—IV in FIG. 10.

FIG. 10 to FIG. 12 show a semiconductor laser according to a second embodiment of the present invention. FIG. 10 is a plan view of the semiconductor laser according to the present embodiment, FIG. 11 is a cross sectional view about the line III—III in FIG. 10, and FIG. 12 is a cross sectional view about the line IV—IV in FIG. 10. The semiconductor laser according to the present embodiment is a buried-heterostructure (BH) type and has a 1.55-micrometer band.

As shown in FIG. 10, the semiconductor laser according to the second embodiment includes: a first multi-mode waveguide 2 formed in a multi-mode waveguide region; a single mode waveguide 1 formed at the light incident side of the first multi-mode waveguide 2 in a single mode waveguide region; and a tapered waveguide 3 connecting the single mode waveguide 1 to the first multimode waveguide 2.

The first multi-mode waveguide 2 formed in the multi-mode waveguide region is constituted as one input and one output type multi-mode interference type (1×1-MMI.) The respective regions have length as follows: length of the single mode waveguide 1 is about 50 micrometers, length of the first multi-mode waveguide 2 is about 260 micrometers, length of the tapered waveguide 3 is about 50 micrometers, and the entire length of the semiconductor laser is about 360 micrometers.

As shown in FIG. 11 and FIG. 12, the semiconductor laser according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and a p-InP second cladding layer 27 and a $p^+$-InGaAs cap layer 28 which are layered on the p-InP first cladding layer 24 and the n-InP current blocking layer 26.

As shown in FIG. 11 and FIG. 12, the active layer 23 is made from 1.55-micrometer composition InGaAsP and has a current confinement structure defined by the p-InP current blocking layer 25 and the n-InP current blocking layer 26. The active layer 23 is covered by the p-InP first cladding layer 24, the p-InP second cladding layer 27 and the $p^+$-InGaAs cap layer 28.

As shown in FIG. 11 and FIG. 12, the p-InP current blocking layer 25 and the n-InP current blocking layer 26 are formed in such a manner that only the p-InP current blocking layer 25 is in contact with the side wall of the mesa 30, and only the n-InP current blocking layer 26 is in contact with the p-InP second cladding layer 27. A comparison of FIG. 11 with FIG. 12 clarifies that the difference between the single mode waveguide 1 and the first multi-mode waveguide 2 is only the waveguide width. As shown in FIG. 11, the single mode waveguide 1 has a waveguide width (W1) set to W1=2 micrometers, and as shown in FIG. 12, the first multi-mode waveguide width (W2) is set to W2=10 micrometers. As for the tapered waveguide 3, its width is 2 micrometers, i.e., identical to the single mode waveguide 1, at the end coupled to the single mode waveguide 1 and the width at the end coupled to the first multi-mode waveguide 2 is W3=3.5 micrometers.

The production method of the semiconductor laser according to the present embodiment is identical to the production method of the semiconductor laser according to the first embodiment.

The semiconductor laser according to the present embodiment is a laser oscillating a single mode which can achieve a high output compared to a conventional single mode laser and improve the COD level. Furthermore, the semiconductor laser according to the present embodiment can improve the spatial hole burning compared to a conventional laser using a multi-mode waveguide having a flare structure. Moreover, the semiconductor laser has an excellent mode stability and does not cause efficiency lowering due to a mode conversion loss. Furthermore, the semiconductor laser according to the present embodiment can improve coupling efficiency with an optical fiber. Hereinafter, explanation will be given on the principle explaining these merits.

As shown in FIG. 10, the semiconductor laser according to the present embodiment, compared to the semiconductor laser according to the first embodiment, has a tapered waveguide region 3 between the single mode waveguide 1 and the first multi-mode waveguide 2.

Thus, like the first embodiment, the present embodiment has a structure including the multi-mode waveguide 2 and accordingly, it is possible to improve the gain saturation level of the active layer 23 compared to an ordinary single mode semiconductor laser.

Moreover, in the semiconductor laser according to the present embodiment, like in the first embodiment, the light output end is constituted by the end of the multi-mode waveguide 2. This improves the COD (catastrophic optical damage) level compared to an ordinary semiconductor laser using a single mode waveguide.

Furthermore, in the semiconductor laser according to the present embodiment, its output mode can be controlled independently by the single mode waveguide 1, and the multi-mode waveguide 2 formed as the 1×1-MMI. in this embodiment does not operate as the 1×1-MMI. for the odd mode 15 according to the MMI. theory. That is, no odd modes are excited.

Accordingly, the spatial hole burning is not easily caused compared to the conventional semiconductor laser utilizing the multi-mode waveguide having the flare structure as shown in FIG. 9. This enables to realize a semiconductor laser having an excellent mode stability.

In addition to the aforementioned, the semiconductor laser according to the present embodiment uses the multi-mode waveguide 2 performing the MMI. operation and accordingly, no mode conversion loss is generated in principle.

Accordingly, the semiconductor laser according to the present embodiment does not cause efficiency lowering as is observed in the conventional semiconductor laser utilizing the flare structure.

Furthermore, the semiconductor laser according to the present embodiment has such a structure that the tapered waveguide 3 is inserted between the single mode waveguide 1 and the multi-mode waveguide 2. Accordingly, it is possible to reduce the coupling loss (through very little) between the single mode waveguide 1 and the first multi-mode waveguide 2 almost to 0 dB.

It should be noted that in the present embodiment, although the tapered waveguide 3 is implemented, the region of the waveguide 3 is very small. Accordingly, almost no mode conversion loss is caused and the mode stability can be maintained by the no odd mode pumping condition in the MMI. region.

Moreover, the tapered waveguide 3 widens the optical field at the light output end of the multi-mode waveguide 2. As a result, the coupling efficiency with the single mode optical fiber is improved.

Figure 13:
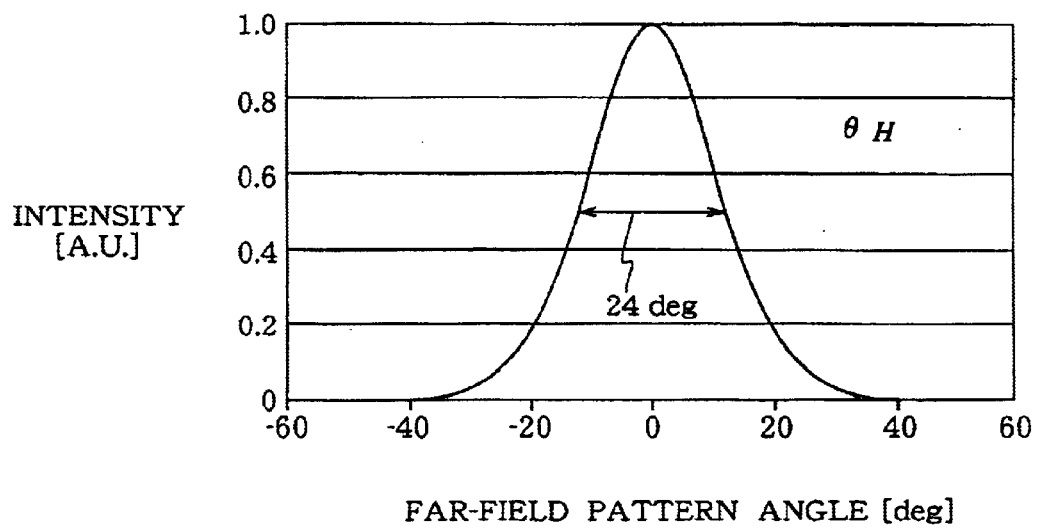
Figure 14:
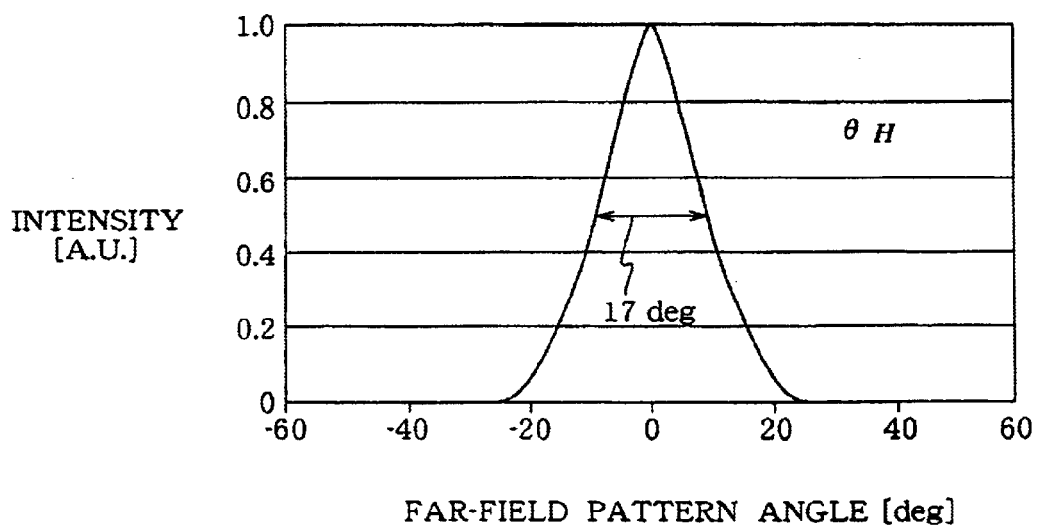

FIG. 13 is a graphic view showing a far-field pattern of width W1=2 micrometers calculated when a light is emitted by the ordinary single mode waveguide, whereas FIG. 14 is a graphic view showing a far-field pattern calculated when light is emitted at the end of the multi-mode waveguide 2 coupled to the tapered waveguide 3 according to the present embodiment.

A comparison of FIG. 13 with FIG. 14 clarifies that in the semiconductor laser according to the present embodiment, the half value width of the far-field pattern is improved from 24 degrees to 17 degrees. This improves the coupling loss with the single mode optical fiber by about 1 dB.

Moreover, the layered configuration of the semiconductor laser according to the present embodiment is equivalent to the layered configuration of an ordinary semiconductor laser. Accordingly, like the first embodiment, the semiconductor laser according to the present embodiment can be produced by the same production procedure of the ordinary semiconductor laser. That is, the semiconductor laser according to the present embodiment can be produced comparatively easily by using only the established production method, i.e., with a high repeatability and yield.

Moreover, since the semiconductor laser according to the present embodiment has a comparatively simple configuration, it can also be applied to an integrated optical device.

[Embodiment 3]

Figure 15:
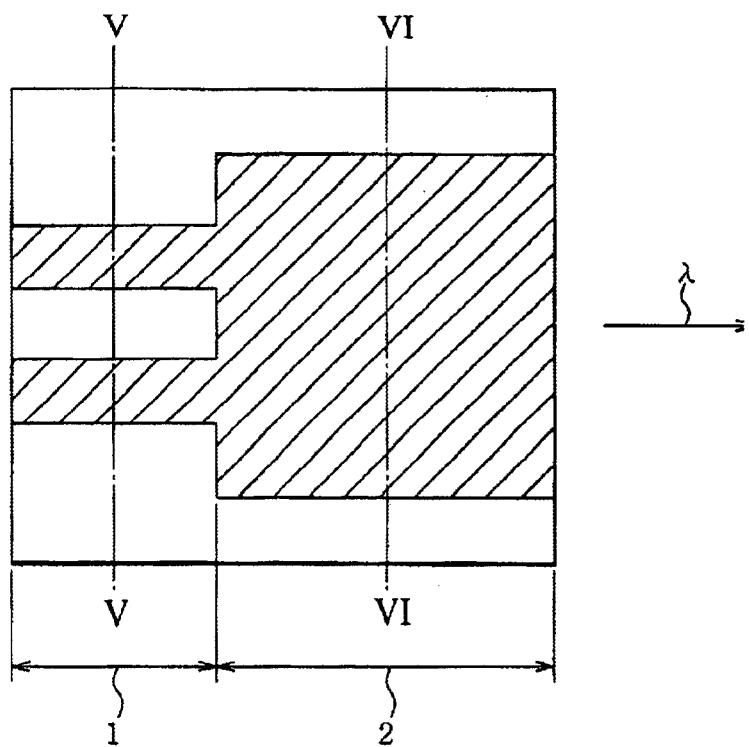
Figure 16:
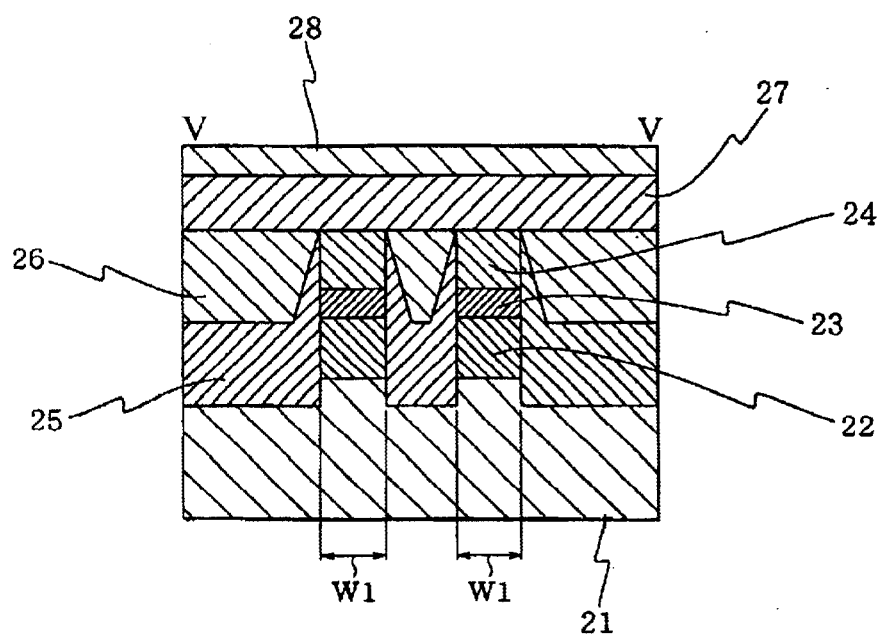
FIG. 16 is a cross-sectional view about the line V—V in FIG. 15.
Figure 17:
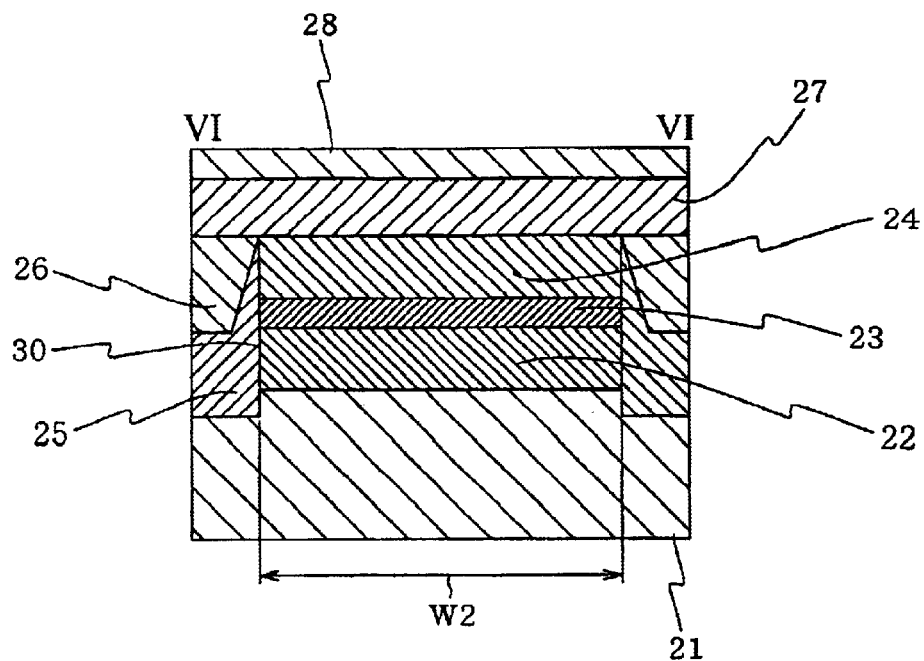
FIG. 17 is a cross-sectional view about the line VI—VI in FIG. 15.

FIG. 15 to FIG. 17 show a semiconductor laser according to a third embodiment of the present invention. FIG. 15 is a plan view of the semiconductor laser according to the present embodiment, FIG. 16 is a cross sectional view about the line V—V in FIG. 15, and FIG. 17 is a cross sectional view about the line VI—VI in FIG. 15. The semiconductor laser according to the present embodiment has a buried heterostructure (BH) with a 1.55-micrometer band.

As shown in FIG. 15, the semiconductor laser according to the present embodiment includes a first multi-mode waveguide 2 formed in a multi-mode waveguide region and a single mode waveguide 1 formed in a single mode waveguide region and coupled to the light incident end of the first multi-mode waveguide 2.

The first multi-mode waveguide 2 formed in the multi-mode waveguide region is formed as a 1×2-MMI. The single mode waveguide 1 has a length of about 50 micrometers, the first multi-mode waveguide 2 has a length of about 460 micrometers, and the entire length of the semiconductor laser is about 510 micrometers.

As shown in FIG. 16 and FIG. 17, the semiconductor laser according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and a p-InP second cladding layer 27 and a p$^+$-InGaAs cap layer 28 which are layered on the p-InP first cladding layer 24 and the n-InP current blocking layer 26.

As shown in FIG. 16 and FIG. 17, the active layer 23 is made from 1.55-micrometer composition InGaAsP and has a current confinement structure defined by the p-InP current blocking layer 25 and the n-InP current blocking layer 26. The active layer 23 is covered by the p-InP first cladding layer 24, the p-InP second cladding layer 27 and the p-InGaAs cap layer 28.

As shown in FIG. 16 and FIG. 17, the p-InP current blocking layer 25 and the n-InP current blocking layer 26 are formed in such a manner that only the p-InP current blocking layer 25 is in contact with the side wall of the mesa 30, and only the n-InP current blocking layer is in contact with the p-InP second cladding layer 27.

A comparison of FIG. 16 with FIG. 17 clarifies that the difference between the single mode waveguide 1 and the first multi-mode waveguide 2 is only the waveguide width. As shown in FIG. 16, the single mode waveguide 1 has a waveguide width (W1) set to W1=2 micrometers, and as shown in FIG. 17, the first multi-mode waveguide width (W2) is set to W2=20 micrometers.

The production method of the semiconductor laser according to the present embodiment is identical to the production method of the semiconductor laser according to the first embodiment.

The semiconductor laser according to the present embodiment is a laser oscillating a single mode, which can achieve a high output compared to a conventional single mode laser and improve the COD. Furthermore, the semiconductor laser according to the present embodiment can improve the spatial hole burning compared to a conventional laser using a multi-mode waveguide having a flare structure. Moreover, the semiconductor laser has an excellent mode stability and does not cause efficiency lowering due to a mode conversion loss. Hereinafter, explanation will be given on the principle explaining these merits.

In the semiconductor laser according to the present embodiment, the first multi-mode waveguide 2 is designed as a 1×2-MMI. Moreover, the first multi-mode waveguide 2 is connected to two single mode waveguides 1. Accordingly, at the other end, i.e., the light output end of the first multi-mode waveguide 2, it is possible to obtain a single mode oscillation.

Thus, like the first embodiment, the present embodiment has a structure including the multi-mode waveguide 2 and accordingly, it is possible to improve the gain saturation level of the active layer 23 compared to an ordinary single mode semiconductor laser.

Moreover, in the semiconductor laser according to the present embodiment, like in the first embodiment, the light output end is constituted by the end of the multi-mode waveguide 2. This improves the COD (catastrophic optical damage) level compared to an ordinary semiconductor laser using a single mode waveguide.

Furthermore, in the semiconductor laser according to the present embodiment, its output mode can be controlled independently by the single mode waveguide 1, and in this embodiment no odd mode is caused. Accordingly, the spatial hole burning is not easily caused compared to the conventional semiconductor laser utilizing the multi-mode waveguide having the flare structure as shown in FIG. 9. This enables to realize a semiconductor laser having an excellent mode stability.

In addition to the aforementioned, the semiconductor laser according to the present embodiment uses the multi-mode waveguide 2 performing the MMI. operation and accordingly, no mode conversion loss is generated in principle. Accordingly, the semiconductor laser according to the present embodiment does not cause efficiency lowering as is observed in the conventional semiconductor laser utilizing the flare structure.

Moreover, the layered configuration of the semiconductor laser according to the present embodiment is equivalent to the layered configuration of an ordinary semiconductor laser. Accordingly, like the first embodiment, the semiconductor laser according to the present embodiment can be produced by the same production procedure of the ordinary semiconductor laser. That is, the semiconductor laser according to the present embodiment can be produced by using only the established production method, i.e., with a high repeatability and yield.

Moreover, since the semiconductor laser according to the present embodiment has a comparatively simple configuration, it can also be applied to an integrated optical device.

[Embodiment 4]

Figure 18:
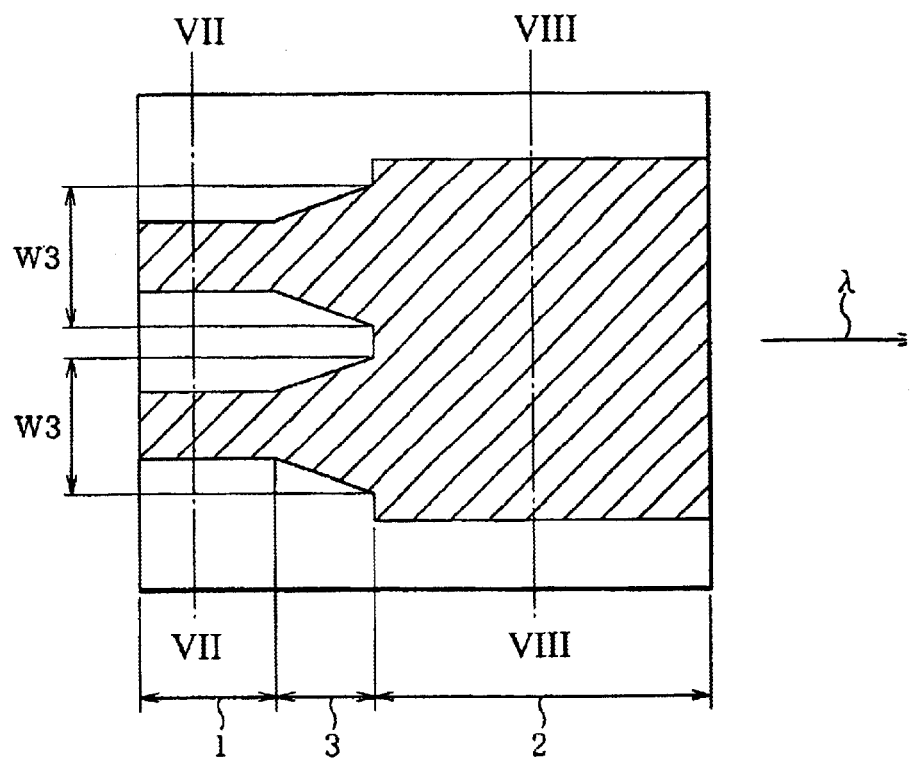
Figure 19:
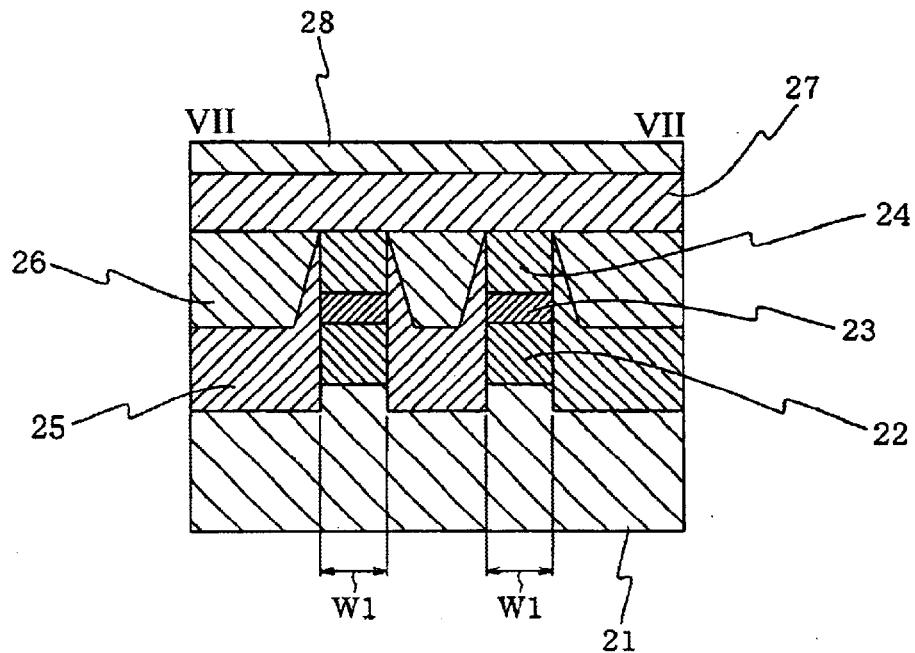
FIG. 19 is a cross sectional view about the line VII—VII in FIG. 18.
Figure 20:
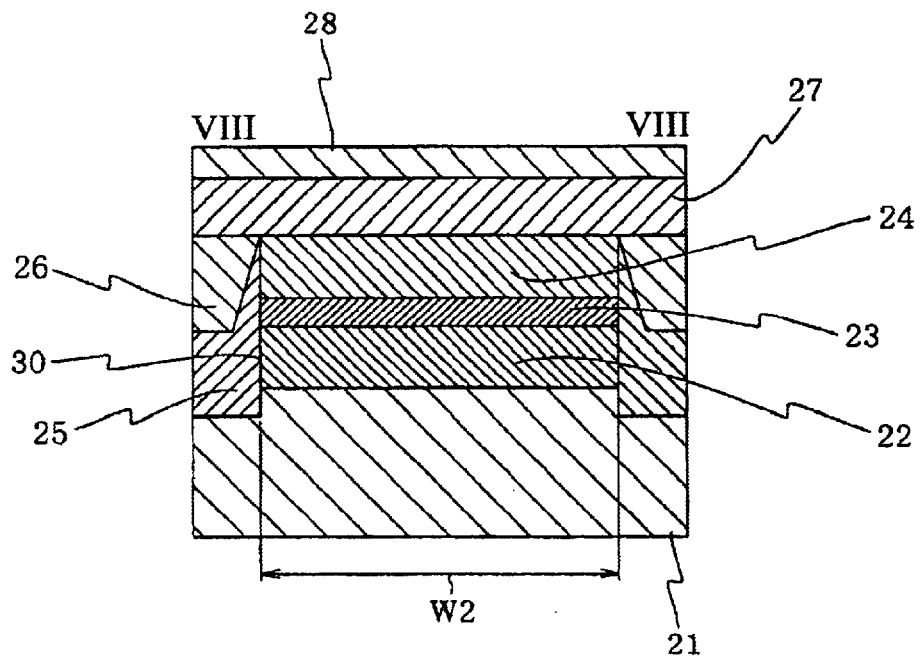
FIG. 20 is a cross sectional view about the line VIII—VIII in FIG. 18.

FIG. 18 to FIG. 20 show a semiconductor laser according to a fourth embodiment of the present invention. FIG. 18 is a plan view of the semiconductor laser according to the present embodiment, FIG. 19 is a cross sectional view about the line VII—VII in FIG. 18, and FIG. 20 is a cross sectional view about the line VIII—VIII in FIG. 18. The semiconductor laser according to the present embodiment is a buried-heterostructure (BH) type and has a 1.55-micrometer band.

As shown in FIG. 18, the semiconductor laser according to the present embodiment includes: a first multi-mode waveguide 2 formed in a multi-mode waveguide region; a single mode waveguide 1 formed at the light incident end of the first multi-mode waveguide 2, in a single mode waveguide region; and a tapered waveguide 3 coupling the first multi-mode waveguide 2 to the single mode waveguide 1.

The first multi-mode waveguide 2 formed in the multi-mode waveguide region is constituted as 1×2-MMI. The respective regions have length as follows: the single mode waveguide 1 is about 50 micrometers long, the first multi-mode waveguide 2 is about 460 micrometers, the tapered waveguide 3 is about 50 micrometers, and the entire length of the semiconductor laser is about 560 micrometers.

As shown in FIG. 19 and FIG. 20, the semiconductor laser according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and p-InP second cladding layer 27 and $p^+$-InGaAs cap layer 28 which are layered on the p-InP first cladding layer 24 and the n-InP current blocking layer 26.

As shown in FIG. 19 and FIG. 20, the active layer 23 is made from 1.55-micrometer composition InGaAsP and has a current confinement structure defined by the p-InP current blocking layer 25 and the n-InP current blocking layer 26. The active layer 23 is covered by the p-InP first cladding layer 24, the p-InP second cladding layer 27 and the $p^+$-InGaAs cap layer 28.

As shown in FIG. 19 and FIG. 20, the p-InP current blocking layer 25 and the n-InP current blocking layer 26 are formed in such a manner that only the p-InP current blocking layer 25 is in contact with the side wall of the mesa 30, and only the n-InP current blocking layer is in contact with the p-InP second cladding layer 27.

A comparison of FIG. 19 with FIG. 20 clarifies that the difference between the single mode waveguide 1 and the first multi-mode waveguide 2 is only the waveguide width. As shown in FIG. 19, the single mode waveguide 1 has a waveguide width (W1) set to W1=2 micrometers, and as shown in FIG. 20, the first multi-mode waveguide 2 width (W2) is set to W2=20 micrometers. As for the tapered waveguide 3, its width is 2 micrometers, i.e., identical to the single mode waveguide 1, at the end coupled to the single mode waveguide 1 and the width at the end coupled to the first multi-mode waveguide 2 is W3=3.5 micrometers.

The production method of the semiconductor laser according to the present embodiment is identical to the production method of the semiconductor laser according to the first embodiment.

The semiconductor laser according to the present embodiment is a laser oscillating a single mode, which can achieve a high output compared to a conventional single mode laser and improve the COD level. Furthermore, the semiconductor laser according to the present embodiment can improve the spatial hole burning compared to a conventional laser using a multi-mode waveguide having a flare structure. Moreover, the semiconductor laser has an excellent mode stability and does not cause efficiency lowering due to a mode conversion loss. Furthermore, the semiconductor laser according to the present embodiment can improve coupling efficiency with an optical fiber. Hereinafter, explanation will be given on the principle explaining these merits. In the semiconductor laser according to the present embodiment, like in the third embodiment, the first multi-mode waveguide 2 is designed as 1×2-MMI. Moreover, the first multi-mode waveguide 2 is connected to two single mode waveguides 1 via tapered waveguides 3. Accordingly, at the other end of the first multi-mode waveguide 2, i.e., at the light output end, it is possible to obtain a single mode oscillation.

The semiconductor laser according to the present embodiment, like the first embodiment, has a structure including the multi-mode waveguide 2 and accordingly, it is possible to improve the gain saturation level of the active layer 23 compared to an ordinary single mode semiconductor laser.

Moreover, in the semiconductor laser according to the present embodiment, like in the first embodiment, the light output end is constituted by the end of the multi-mode waveguide 2. This improves the COD (catastrophic optical damage) level compared to an ordinary semiconductor laser using a single mode waveguide.

Furthermore, in the semiconductor laser according to 20 the present embodiment, its output mode can be controlled independently by the single mode waveguide 1, and no odd modes are excited. Accordingly, the spatial hole burning is not easily caused compared to the conventional semiconductor laser utilizing the multi-mode waveguide having the flare structure. This enables to realize a semiconductor laser having an excellent mode stability.

In addition to the aforementioned, the semiconductor laser according to the present embodiment uses the multi-mode waveguide 2 performing the MMI. operation and accordingly, no mode conversion loss is generated in principle.

Accordingly, the semiconductor laser according to the present embodiment does not cause efficiency lowering as is observed in the conventional semiconductor laser utilizing the flare structure.

Furthermore, the semiconductor laser according to the present embodiment has such a structure that the tapered waveguide 3 is inserted between the single mode waveguide 1 and the multi-mode waveguide 2. Accordingly, it is possible to reduce the coupling loss (through very little) between the single mode waveguide 1 and the first multi-mode waveguide 2 almost to 0 dB.

It should be noted that in the present embodiment, although the tapered waveguide 3 is implemented, the region of the waveguide 3 is very small. Accordingly, almost no mode conversion loss is caused and the mode stability can be maintained by the no odd mode pumping condition in the MMI. region.

Moreover, the tapered waveguide 3 widens the optical field at the light output end of the multi-mode waveguide 2. As a result, the coupling efficiency with the single mode optical fiber is improved.

Moreover, the layered configuration of the semiconductor laser according to the present embodiment is equivalent to the layered configuration of an ordinary semiconductor laser. Accordingly, like the first embodiment, the semiconductor laser according to the present embodiment can be produced by the same production procedure of the ordinary semiconductor laser. That is, the semiconductor laser according to the present embodiment can be produced comparatively easily by using only an established production method, i.e., with a high repeatability and yield. Moreover, since the semiconductor laser according to the present embodiment has a comparatively simple configuration, it can also be applied to an integrated optical device.

[Embodiment 5]

Figure 21:
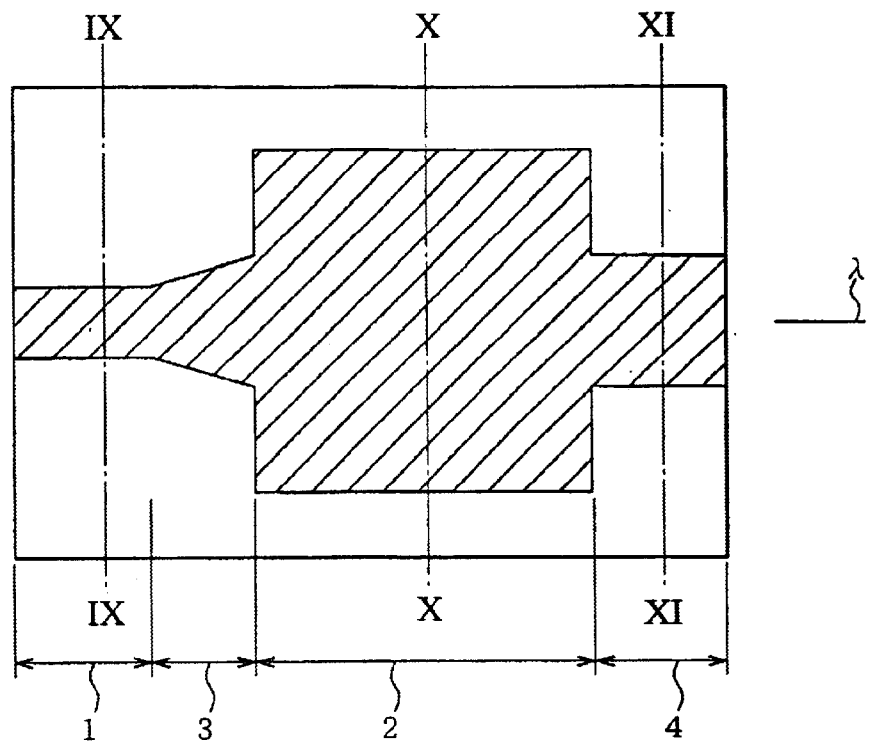
Figure 22:
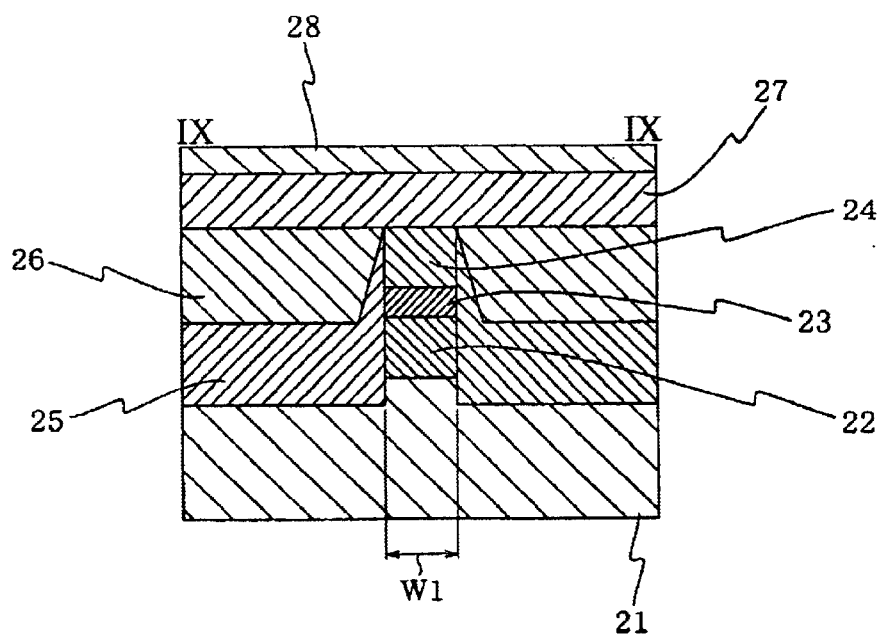
FIG. 22 is a cross sectional view about the line IX—IX in FIG. 21.
Figure 23:
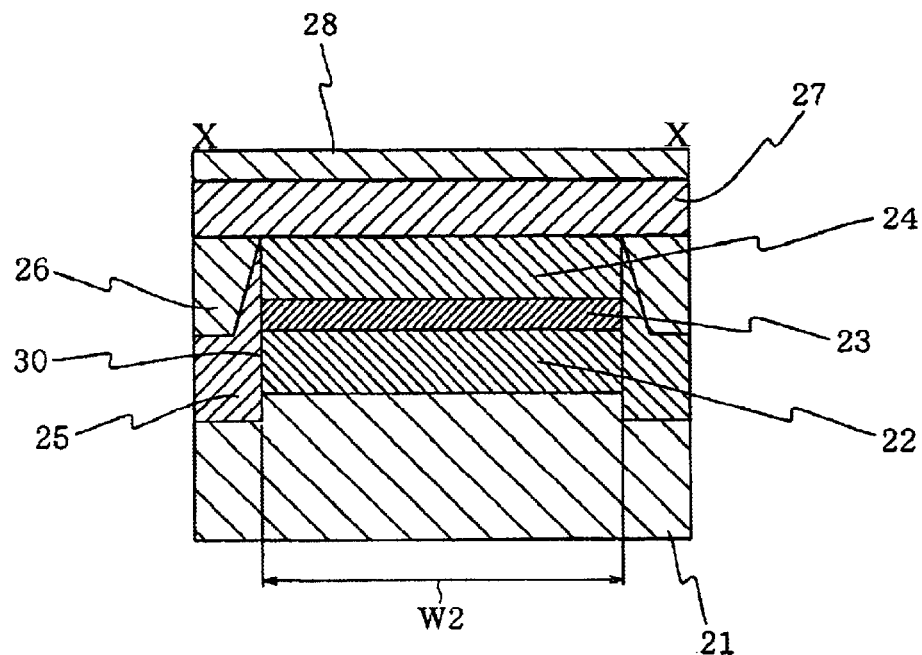
FIG. 23 is a cross sectional view about the line X—X in FIG. 21.
Figure 24:
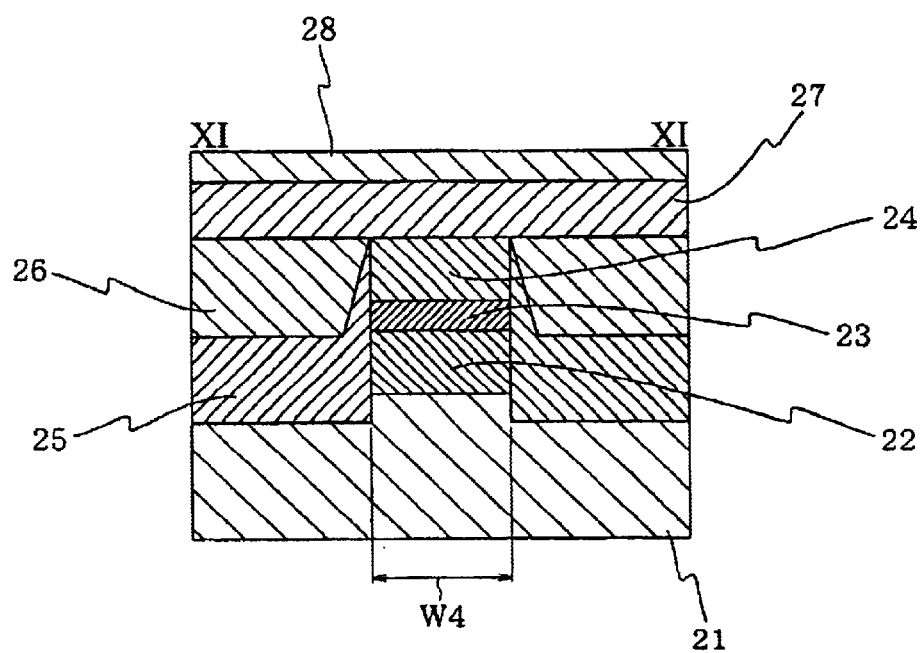
FIG. 24 is a cross sectional view about the line XI—XI in FIG. 21.

FIG. 21 to FIG. 24 show a semiconductor laser according to a fifth embodiment of the present invention. FIG. 21 is a plan view of the semiconductor laser according to the present embodiment, FIG. 22 is a cross sectional view about the line IX—IX in FIG. 21, FIG. 23 is a cross sectional view about the line X—X in FIG. 21, and FIG. 24 is a cross sectional view about the line XI—XI in FIG. 21. The semiconductor laser according to the present embodiment is a buried-heterostructure (BH) type and has a 1.55-micrometer band.

As shown in FIG. 21, the semiconductor laser according to the present embodiment includes: a first multi-mode waveguide 2 formed in a multi-mode waveguide region; a single mode waveguide 1 formed in a single mode waveguide region; a tapered waveguide 3 connecting the single mode waveguide 1 to the first multi-mode waveguide 2; and a second multi-mode waveguide 4 formed to be coupled to the first multi-mode waveguide 2 at the light incident side of the first multi-mode waveguide 2.

The first multi-mode waveguide 2 formed in the multi-mode waveguide region is constituted as a one-input one-output interference type waveguide (1×1-MMI.) Moreover, the second multi-waveguide region 4 is designed as a secondary mode cleaved waveguide.

The respective regions have length as follows: the single mode waveguide 1 has a length of about 50 micrometers, the first multi-mode waveguide 2 has a length of about 260 micrometers, the tapered waveguide 3 has a length of about 50 micrometers, the second multi-mode waveguide 4 has a length of about 50 micrometers, and the entire length of the semiconductor laser is about 410 micrometers.

As shown in FIG. 22 to FIG. 24, the semiconductor laser according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and p-InP second cladding layer 27 and p$^+$-InGaAs cap layer 28 which are layered on the p-InP first cladding layer 24 and the n-InP current blocking layer 26.

As shown in FIG. 22 to FIG. 24, the active layer 23 is made from 1.55-micrometer composition InGaAsP and has a current confinement structure defined by the p-InP current blocking layer 25 and the n-InP current blocking layer 26.

The active layer 23 is covered by the p-InP first cladding layer 24, the p-InP second cladding layer 27 and the p$^+$-InGaAs cap layer 28.

As shown in FIG. 22 to FIG. 24, the p-InP current blocking layer 25 and the n-InP current blocking layer 26 are formed in such a manner that only the p-InP current blocking layer 25 is in contact with the side wall of the mesa 30, and the only the n-InP current blocking layer 26 is in contact with the p-InP second cladding layer 27.

A comparison of FIG. 22 with FIG. 23 and FIG. 24 clarifies that the difference between the single mode waveguide 1, the first multi-mode waveguide 2, and the second multi-mode waveguide 4 is only the waveguide width. As shown in FIG. 22, the single mode waveguide 1 has a waveguide width (W1) set to W1=2 micrometers, and as shown in FIG. 23, the first multi-mode waveguide 2 width (W2) is set to W2=10 micrometers. As for the tapered waveguide 3, its width is 2 micrometers, i.e., identical to the single mode waveguide 1, at the end coupled to the single mode waveguide 1 and the width at the end coupled to the first multi-mode waveguide 2 is W3=3.5 micrometers. Moreover, as shown in FIG. 24, the second multi-mode waveguide 4 has a width (W4) set to W4=3.5 micrometers.

The production method of the semiconductor laser according to the present embodiment is identical to the production method of the semiconductor laser according to the first embodiment.

The semiconductor laser according to the present embodiment is a laser oscillating a single mode, which can achieve a high output compared to a conventional single mode laser and improve the COD level. Furthermore, the semiconductor laser according to the present embodiment can improve the spatial hole burning compared to a conventional laser using a multi-mode waveguide having a flare structure. Moreover, the semiconductor laser according to the present embodiment has an excellent mode stability and does not cause efficiency lowering due to a mode conversion loss.

Furthermore, the semiconductor laser according to the present embodiment can improve coupling efficiency with an optical fiber. Hereinafter, explanation will be given on the principle explaining these merits.

The semiconductor laser according to the present embodiment is identical to the semiconductor laser according to the second embodiment except for that the second multi-mode region 4 is added.

Thus, the semiconductor laser according to the present embodiment includes the multi-mode waveguide 2 like the second embodiment and accordingly, can improve the gain saturation level of the active layer 23 compared to an ordinary single mode semiconductor laser.

Moreover, in the semiconductor laser according to the present embodiment, like in the first embodiment, the light output end is constituted by the end of the second multi-mode waveguide 4 which is the multi-mode waveguide. This improves the COD (catastrophic optical damage) level compared to an ordinary semiconductor laser using a single mode waveguide.

Furthermore, in the semiconductor laser according to the present embodiment, its output mode can be controlled independently by the single mode waveguide 1, and the multi-mode waveguide 2 formed as 1×1-MMI., according to the MMI. theory, does not operate 1×1-MMI. for the odd modes. That is, no odd modes are excited. Accordingly, the spatial hole burning is not easily caused compared to the conventional semiconductor laser utilizing the multi-mode waveguide having the flare structure as shown in FIG. 9. This enables to realize a semiconductor laser having an excellent mode stability.

In addition to the aforementioned, the semiconductor laser according to the present embodiment uses the multi-mode waveguides 2 and 4 performing the MMI. operation and accordingly, no mode conversion loss is generated in principle. Accordingly, the semiconductor laser according to the present embodiment does not cause efficiency lowering as is observed in the conventional semiconductor laser utilizing the flare structure.

Furthermore, the semiconductor laser according to the present embodiment has such a structure that the tapered waveguide 3 is inserted between the single mode waveguide 1 and the first multi-mode waveguide 2. Accordingly, it is possible to reduce the coupling loss (though very little) between the single mode waveguide 1 and the first multi-mode waveguide 2 almost to 0 dB.

It should be noted that in the present embodiment, although the tapered waveguide 3 is implemented, the region of the waveguide 3 is very small. Accordingly, almost no mode conversion loss is caused and the mode stability can be maintained by the no odd mode pumping condition in the MMI. region.

Moreover, the tapered waveguide 3 widens the optical field at the light output end of the multi-mode waveguide. As a result, the coupling efficiency with the single mode optical fiber is improved.

Moreover, in the semiconductor laser according to the present embodiment, the light output end is constituted by the second mode cleaved waveguide (second multi-mode waveguide) 4 which is different from the first multi-mode waveguide 2 in which the light output end is a main pumping region. Accordingly, the tolerance for the cutting position is mitigated, facilitating a production procedure. It should be noted that since the first multi-mode waveguide 2 is designed in such a manner that no odd modes are excited.

Accordingly, even if the second multi-mode waveguide 4 is used as a waveguide of the output side, only the single mode is output without deteriorating the mode stability. Moreover, the layered configuration of the semiconductor laser according to the present embodiment is equivalent to the layered configuration of an ordinary semiconductor laser.

Accordingly, like the first embodiment, the semiconductor laser according to the present embodiment can be produced by the same production procedure of the ordinary semiconductor laser. That is, the semiconductor laser according to the present embodiment can be produced comparatively easily by using only an established production method, i.e., with a high repeatability and yield. Moreover, since the semiconductor laser according to the present embodiment has a comparatively simple configuration, it can also be applied to an integrated optical device.

[Embodiment 6]

FIG. 21 to FIG. 24 show a semiconductor laser according to a fifth embodiment of the present invention. FIG. 21 is a plan view of the semiconductor laser according to the present embodiment, FIG. 22 is a cross sectional view about the line IX—IX in FIG. 21, FIG. 23 is a cross sectional view about the line X—X in FIG. 21, and FIG. 24 is a cross sectional view about the line XI—XI in FIG. 21. The semiconductor laser according to the present embodiment is a buried-heterostructure (BH) type and has a 1.55-micrometer band.

Figure 25:
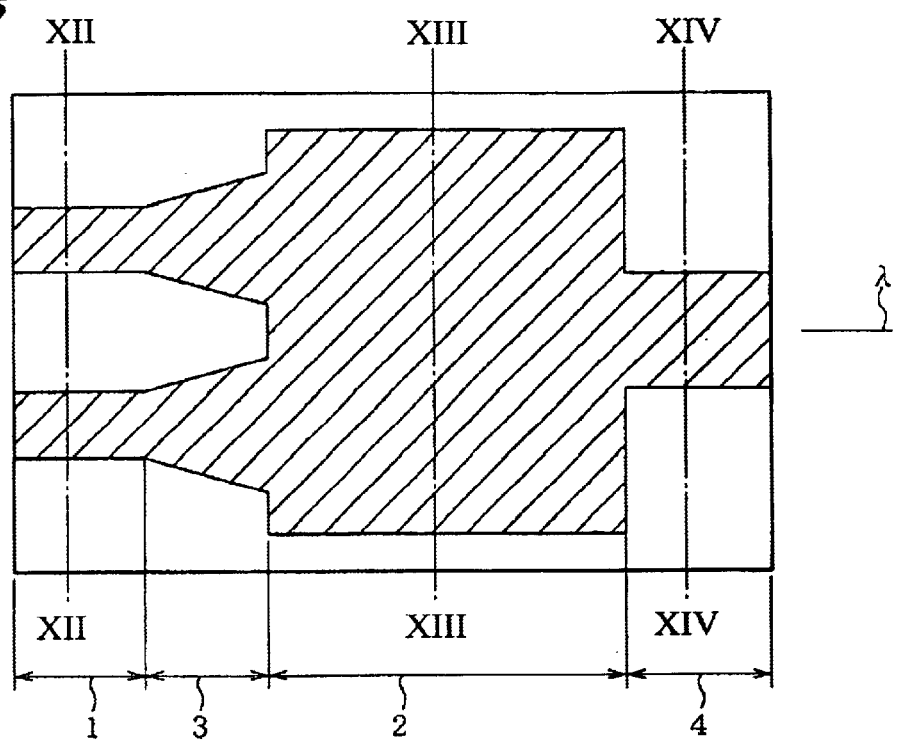

As shown in FIG. 25, the semiconductor laser according to the present embodiment includes: a first multi-mode waveguide 2 formed in a multi-mode waveguide region; a single mode waveguide 1 formed in a single mode waveguide region; a tapered waveguide 3 connecting the single mode waveguide to the first multimode waveguide 2; and a second multi-mode waveguide 4 formed to be coupled to the first multi-mode waveguide 2 at the light incident side of the first multi-mode waveguide 2.

The first multi-mode waveguide 2 formed in the multi-mode waveguide region is constituted as 1×2-MMI. Moreover, the second multi-waveguide region 4 is designed as a secondary mode cleaved waveguide.

The respective regions have length as follows: the single mode waveguide 1 has a length of about 50 micrometers, the first multi-mode waveguide 2 has a length of about 460 micrometers, the tapered waveguide 3 has a length of about 50 micrometers, the second multi-mode waveguide 4 has a length of about 50 micrometers, and the entire length of the semiconductor laser is about 610 micrometers.

As shown in FIG. 25 to FIG. 28, the semiconductor laser according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and p-InP second cladding layer 27 and p$^+$-InGaAs cap layer 28 which are layered on the p-InP first cladding layer 24 and the n-InP current blocking layer 26.

As shown in FIG. 25 to FIG. 28, the active layer 23 is made from 1.55-micrometer composition InGaAsP and has a current confinement structure defined by the p-InP current blocking layer 25 and the n-InP current blocking layer 26. The active layer 23 is covered by the p-InP first cladding layer 24, the p-InP second cladding layer 27 and the p$^+$-InGaAs cap layer 28.

Figure 26:
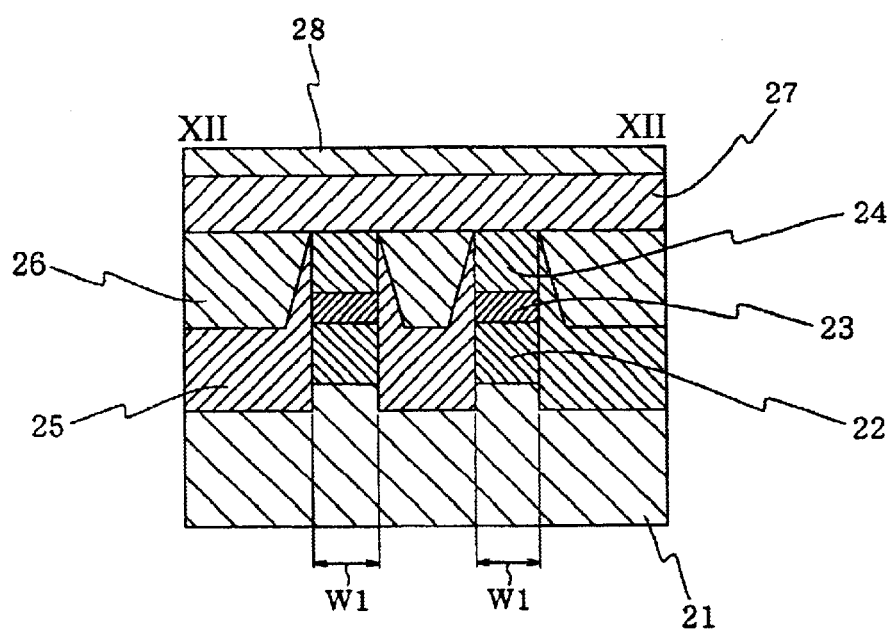
FIG. 26 is a cross sectional view about the line XII—XII in FIG. 25.
Figure 27:
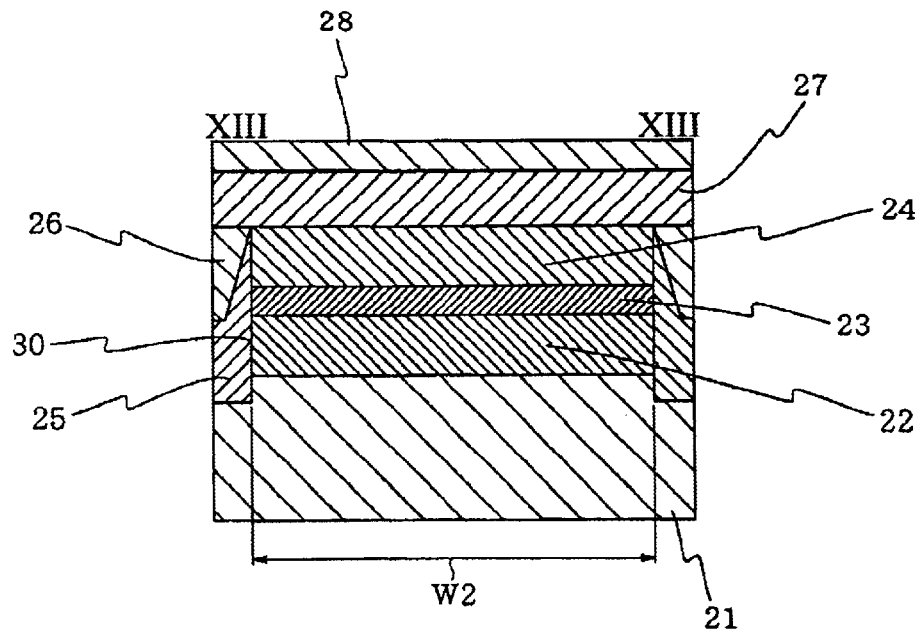
FIG. 27 is a cross sectional view about the line XIII—XIII in FIG. 25.
Figure 28:
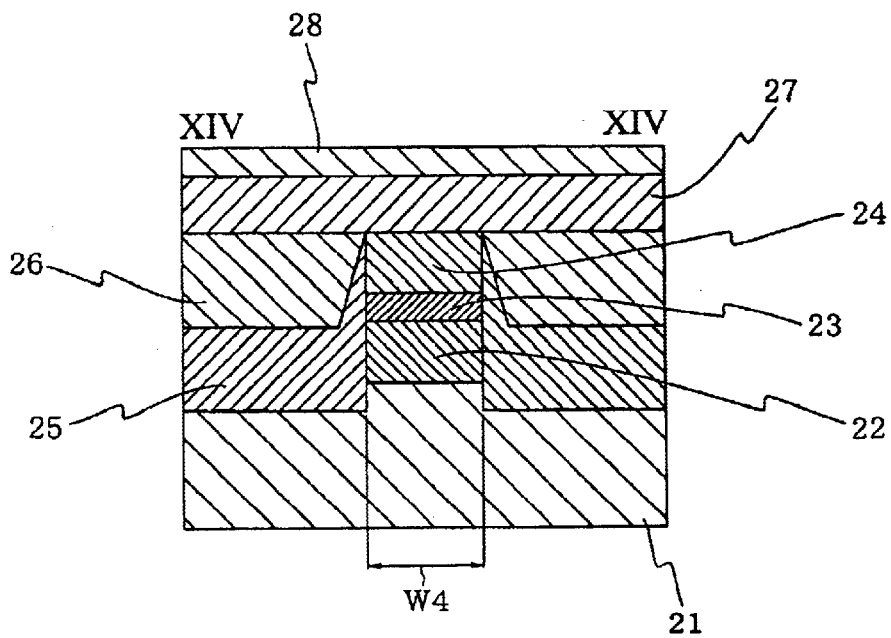
FIG. 28 is a cross sectional view about the line XIV—XIV in FIG. 25.

As shown in FIG. 26 to FIG. 28, the p-InP current blocking layer 25 and the n-InP current blocking layer 26 are formed in such a manner that only the p-InP current blocking layer 25 is in contact with the side wall of the mesa 30, and only the n-InP current blocking layer is in contact with the p-InP second cladding layer 27.

A comparison of FIG. 26 with FIG. 27 and FIG. 28 clarifies that the difference between the single mode waveguide 1, the first multi-mode waveguide 2, and the second multi-mode waveguide 4 is only the waveguide width. As shown in FIG. 26, the single mode waveguide 1 has a waveguide width (W1) set to W1=2 micrometers, and as shown in FIG. 27, the first multi-mode waveguide 2 width (W2) is set to W2=20 micrometers. As for the tapered waveguide 3, its width is 2 micrometers, i.e., identical to the single mode waveguide 1, at the end coupled to the single mode waveguide 1 and the width at the end coupled to the first multi-mode waveguide 2 is W3=3.5 micrometers. Moreover, as shown in FIG. 28, the second nulti-mode waveguide 4 has a width (W4) set to W4=3.5 micrometers.

The production method of the semiconductor laser according to the present embodiment is identical to the production method of the semiconductor laser according to the first embodiment.

The semiconductor laser according to the present embodiment is a laser oscillating a single mode, which can achieve a high output compared to a conventional single mode laser and improve the COD level. Furthermore, the semiconductor laser according to the present embodiment can improve the spatial hole burning compared to a conventional laser using a multi-mode waveguide having a flare structure. Moreover, the semiconductor laser according to the present embodiment has an excellent mode stability and does not cause efficiency lowering due to a mode conversion loss.

Furthermore, the semiconductor laser according to the present embodiment can improve coupling efficiency with an optical fiber. Hereinafter, explanation will be given on the principle explaining these merits.

The semiconductor laser according to the present embodiment is identical to the semiconductor laser according to the fourth embodiment except for that the second multi-mode region 4 is added.

Thus, the semiconductor laser according to the present embodiment includes the multi-mode waveguide 2 like the fourth embodiment and accordingly, can improve the gain saturation level of the active layer 23 compared to an ordinary single mode semiconductor laser.

Moreover, in the semiconductor laser according to the present embodiment, like in the fourth embodiment, the light output end is constituted by the end of the second multi-mode waveguide 4. This improves the COD (catastrophic optical damage) level compared to an ordinary semiconductor laser using a single mode waveguide.

Furthermore, in the semiconductor laser according to the present embodiment, its output mode can be controlled independently by the single mode waveguide 1, and no odd modes are excited. Accordingly, the spatial hole burning is not easily caused compared to the conventional semiconductor laser utilizing the multi-mode waveguide having the flare structure. This enables to realize a semiconductor laser having an excellent mode stability.

In addition to the aforementioned, the semiconductor laser according to the present embodiment uses the multi-mode waveguides 2 and 4 performing the MMI. operation and accordingly, no mode conversion loss is generated in principle. Accordingly, the semiconductor laser according to the present embodiment does not cause efficiency lowering as is observed in the conventional semiconductor laser utilizing the flare structure.

Furthermore, the semiconductor laser according to the present embodiment has such a structure that the tapered waveguide 3 is inserted between the single mode waveguide 1 and the first multi-mode waveguide 2. Accordingly, it is possible to reduce the coupling loss (though very little) between the single mode waveguide 1 and the first multi-mode waveguide 2 almost to 0 dB.

It should be noted that in the present embodiment, although the tapered waveguide 3 is implemented, the region of the waveguide 3 is very small. Accordingly, almost no mode conversion loss is caused and the mode stability can be maintained by the no odd mode pumping condition in the MMI. region.

Moreover, the tapered waveguide 3 widens the optical field at the light output end of the multi-mode waveguide. As a result, the coupling efficiency with the single mode optical fiber is improved.

Moreover, in the semiconductor laser, according to the present embodiment, the light output end is constituted by the second mode cleaved waveguide (second multi-mode waveguide) 4 which is different from the first multi-mode waveguide 2 in which the light output end is a main pumping region. Accordingly, the tolerance for the cutting position is mitigated, facilitating a production procedure.

It should be noted that since the first multi-mode waveguide 2 is designed in such a manner that no odd modes are excited. Accordingly, even if the second multi-mode waveguide 4 is used as a waveguide of the output side, only the single mode is output without deteriorating the mode stability.

Moreover, the layered configuration of the semiconductor laser according to the present embodiment is equivalent to the layered configuration of an ordinary semiconductor laser. Accordingly, like the first embodiment, the semiconductor laser according to the present embodiment can be produced by the same production procedure of the ordinary semiconductor laser. That is, the semiconductor laser according to the present embodiment can be produced comparatively easily by using only an established production method, i.e., with a high repeatability and yield.

Moreover, since the semiconductor laser according to the present embodiment has a comparatively simple configuration, it can also be applied to an integrated optical device.

[Embodiment 7]

Figure 29:
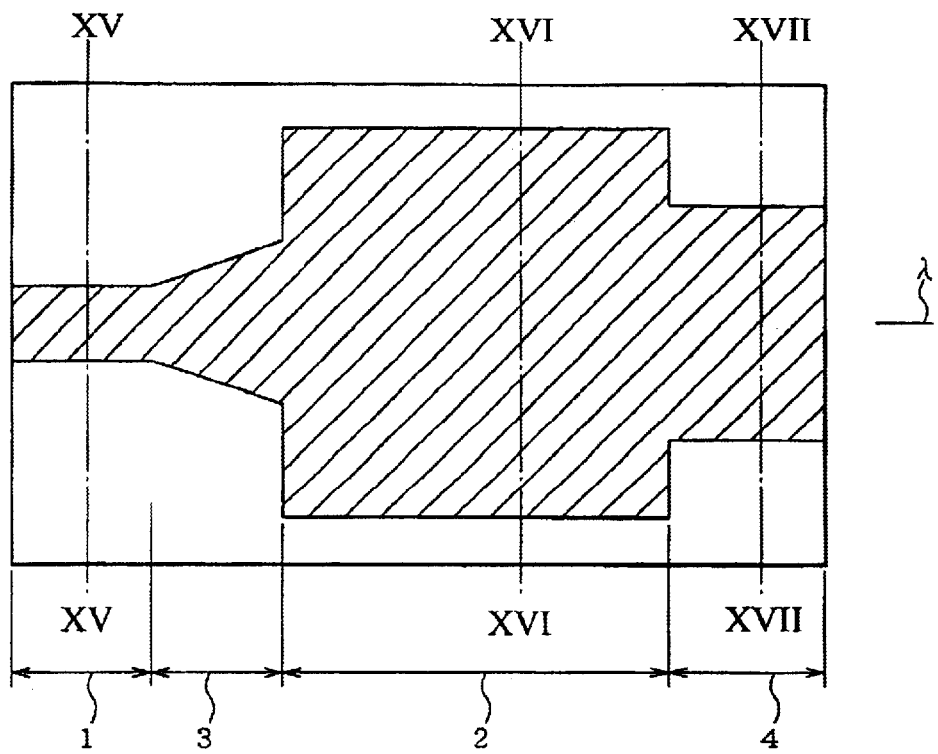
Figure 30:
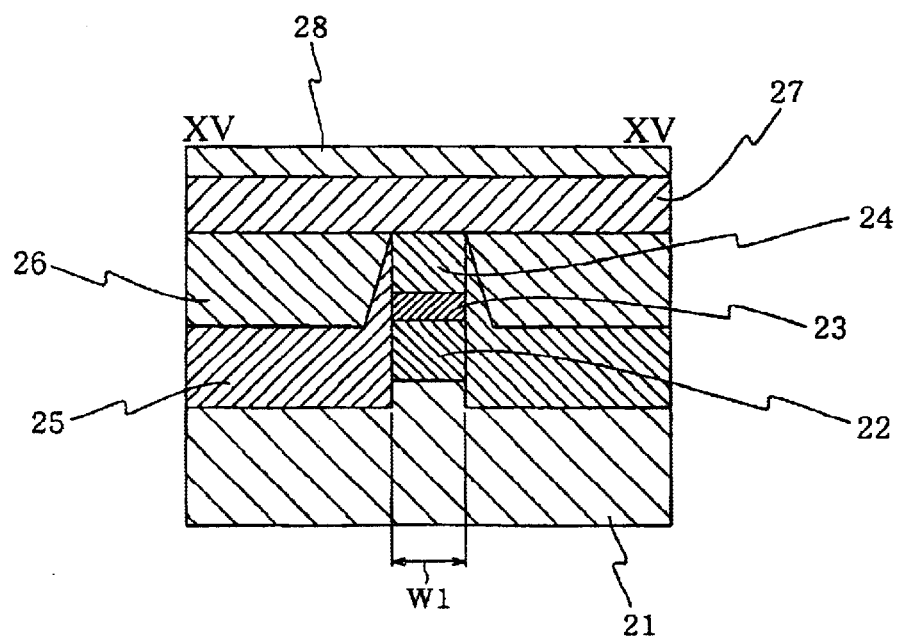
FIG. 30 is a cross sectional view about the line XV—XV in FIG. 29.
Figure 31:
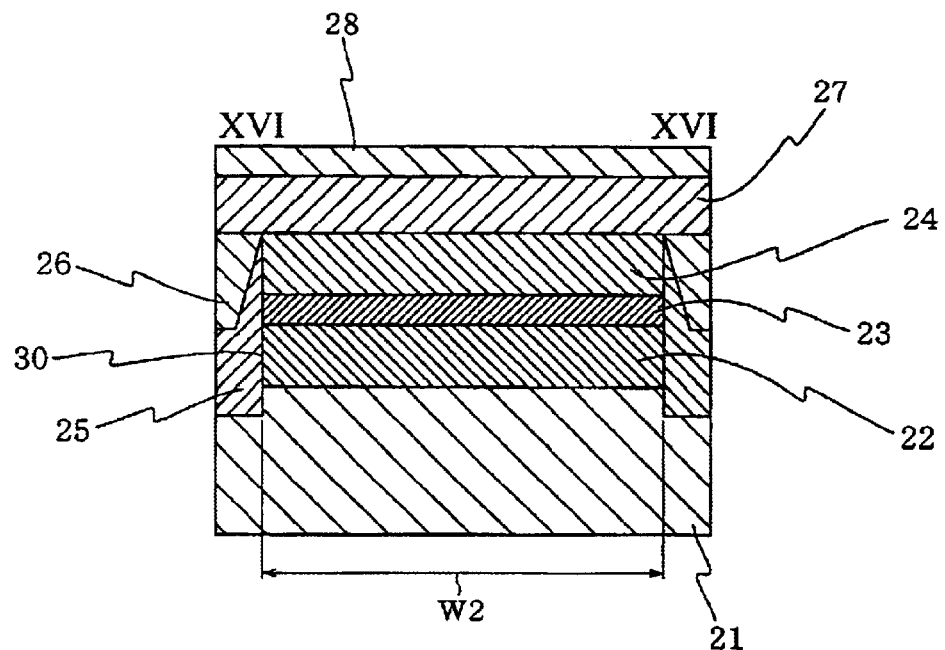
FIG. 31 is a cross sectional view about the line XVI—XVI in FIG. 29.
Figure 32:
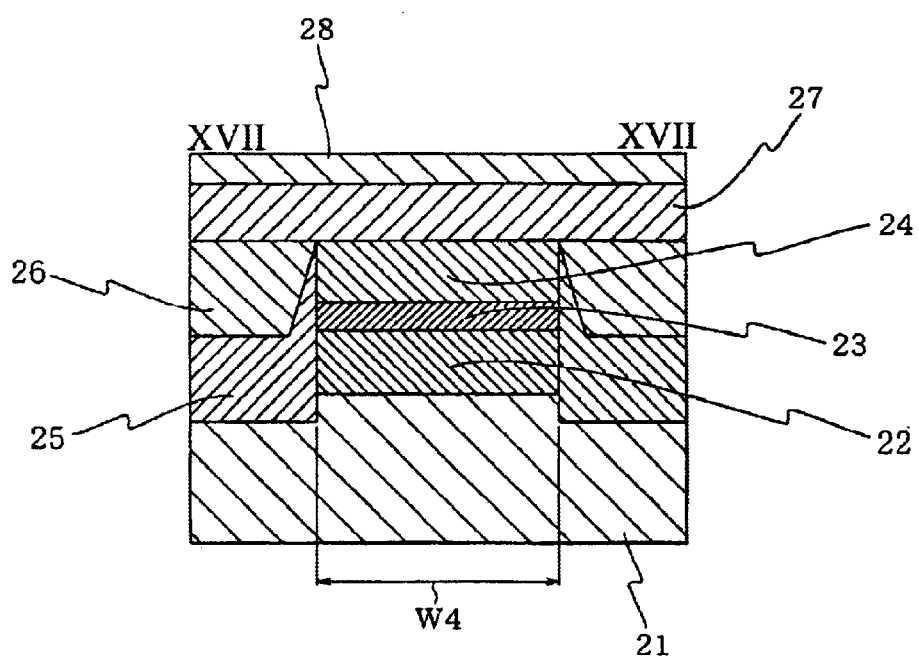
FIG. 32 is a cross sectional view about the line XVII—XVII in FIG. 29.

FIG. 29 to FIG. 32 show a semiconductor laser according to a seventh embodiment of the present invention. FIG. 29 is a plan view of the semiconductor laser according to the present embodiment, FIG. 30 is a cross sectional view about the line [A—A] XV—XV in FIG. 29, FIG. 31 is a cross sectional view about the line XVI—XVI in FIG. 29, and FIG. 32 is a cross sectional view about the line XVII—XVII in FIG. 29. The semiconductor laser according to the present embodiment is a buried-heterostructure (BH) type and has a 1.55-micrometer band.

As shown in FIG. 29, the semiconductor laser according 15 to the present embodiment includes: a first multi-mode waveguide 2 formed in a multi-mode waveguide region; a single mode waveguide 1 formed at in a single mode waveguide region; a tapered waveguide 3 connecting the single mode waveguide 1 to the first multimode waveguide 2; and a second multi-mode waveguide 4 connected to the first multi-mode waveguide 2. Each of the first multi-mode waveguide 2 and the second multi-waveguide 4 is designed as a 1×1-MMI.

The respective regions have length as follows: the single mode waveguide 1 has a length of about 50 micrometers, the first multi-mode waveguide 2 has a length of about 260 micrometers, the tapered waveguide 3 has a length of about 50 micrometers, the second multi-mode waveguide 4 has a length of about 75 micrometers, and the entire length of the semiconductor laser is about 435 micrometers.

As shown in FIG. 30 to FIG. 32, the semiconductor laser according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and p-InP second cladding layer 27 and p⁺-InGaAs cap layer 28 which are layered on the p-InP first cladding layer 24 and the n-InP current blocking layer 26.

As shown in FIG. 30 to FIG. 32, the active layer 2–3 is made from 1.55-micrometer composition InGaAsP and has a current confinement structure defined by the p-InP current blocking layer 25 and the n-InP current blocking layer 26. The active layer 23 is covered by the p-InP first cladding layer 24, the p-InP second cladding layer 27 and the p⁺-InGaAs cap layer 28.

As shown in FIG. 30 to FIG. 32, the p-InP current blocking layer 25 and the n-InP current blocking layer 26 are formed in such a manner that only the p-InP current blocking layer 25 is in contact with the side wall of the mesa 30, and the only the n-InP current blocking layer 26 is in contact with the p-InP second cladding layer 27.

A comparison of FIG. 30 with FIG. 31 and FIG. 32 clarifies that the difference between the single mode waveguide 1, the first multi-mode waveguide 2, and the second multi-mode waveguide 4 is only the waveguide width. As shown in FIG. 30, the single mode waveguide 1 has a waveguide width (W1) set to W1=2 micrometers, and as shown in FIG. 31, the first multi-mode waveguide 2 width (W2) is set to W2=10 micrometers. As for the tapered waveguide 3, its width is 2 micrometers, i.e. identical to the single mode waveguide 1, at the end coupled to the single mode waveguide 1 and the width at the end coupled to the first multi-mode waveguide 2 is W3=3.5 micrometers.

Moreover, as shown in FIG. 32, the second multi-mode waveguide 4 has a width (W4) set to W4=5 micrometers. This second multi-mode waveguide 4 is a multi-mode waveguide allowing the second mode and this second multi-mode waveguide 4 has a length of 75 micrometers, thus realizing the 1×1-MMI structure.

The production method of the semiconductor laser according to the present embodiment is identical to the production method of the semiconductor laser according to the first embodiment.

The semiconductor laser according to the present embodiment is a laser oscillating a single mode, which can achieve a high output compared to a conventional single mode laser and improve the COD level. Furthermore, the semiconductor laser according to the present embodiment can improve the spatial hole burning compared to a conventional laser using a multi-mode waveguide having a flare structure.

Moreover, the semiconductor laser according to the present embodiment has an excellent mode stability and does not cause efficiency lowering due to a mode conversion loss. Furthermore, the semiconductor laser according to the present embodiment can improve coupling efficiency with an optical fiber. Hereinafter, explanation will be given on the principle explaining these merits.

The semiconductor laser according to the present embodiment is identical to the semiconductor laser according to the second embodiment except for that the second multi-mode region 4 is added.

Thus, the semiconductor laser according to the present embodiment includes the multi-mode waveguide 2 like the second embodiment and accordingly, can improve the gain saturation level of the active layer 23 compared to an ordinary single mode semiconductor laser.

Moreover, in the semiconductor laser according to the present embodiment, like in the first embodiment, the light output end is constituted by the end of the second multi-mode waveguide 4 which is a multi-mode waveguide. This improves the COD (catastrophic optical damage) level compared to an ordinary semiconductor laser using a single mode waveguide.

Furthermore, in the semiconductor laser according to 10 the present embodiment, its output mode can be controlled independently by the single mode waveguide 1, and no odd modes are excited. Accordingly, the spatial hole burning is not easily caused compared to the conventional semiconductor laser utilizing the multi-mode waveguide having the flare structure. This enables to realize a semiconductor laser having an excellent mode stability.

In addition to the aforementioned, the semiconductor laser according to the present embodiment uses the multi-mode waveguides 2 and 4 performing the MMI. operation and accordingly, no mode conversion loss is generated in principle. Accordingly, the semiconductor laser according to the present embodiment does not cause efficiency lowering as is observed in the conventional semiconductor laser utilizing the flare structure.

Furthermore, the semiconductor laser according to the present embodiment has such a structure that the tapered waveguide 3 is inserted between the single mode waveguide 1 and the first multi-mode waveguide 2. Accordingly, it is possible to reduce the coupling loss (though very little) between the single mode waveguide 1 and the first multi-mode waveguide 2 almost to 0 dB.

It should be noted that in the present embodiment, although the tapered waveguide 3 is implemented, the region of the waveguide 3 is very small. Accordingly, almost no mode conversion loss is caused and the mode stability can be maintained by the no odd mode pumping condition in the MMI. region.

Moreover, the tapered waveguide 3 widens the optical field at the light output end of the multi-mode waveguide 2. As a result, the coupling efficiency with the single mode optical fiber is improved.

Moreover, in the semiconductor laser according to the present embodiment, the light output end is constituted by the waveguide of 1×1-MMI. structure (the second multi-mode waveguide) 4 which is different from the first multi-mode waveguide 2 in which the light output end is a main pumping region. Accordingly, the tolerance for the cutting position is mitigated, facilitating a production procedure.

It should be noted that since the first multi-mode waveguide 2 is designed in such a manner that no odd modes are excited. Accordingly, even if the second multi-mode waveguide 4 is used as a waveguide of the output side, only the single mode is output without deteriorating the mode stability.

Moreover, the layered configuration of the semiconductor laser according to the present embodiment is equivalent to the layered configuration of an ordinary semiconductor laser. Accordingly, like the first embodiment, the semiconductor laser according to the present embodiment can be produced by the same production procedure of the ordinary semiconductor laser. That is, the semiconductor laser according to the present embodiment can be produced comparatively easily by using only an established production method, i.e., with a high repeatability and yield.

Moreover, since the semiconductor laser according to the present embodiment has a comparatively simple configuration, it can also be applied to an integrated optical device.

[Embodiment 8]

Figure 33:
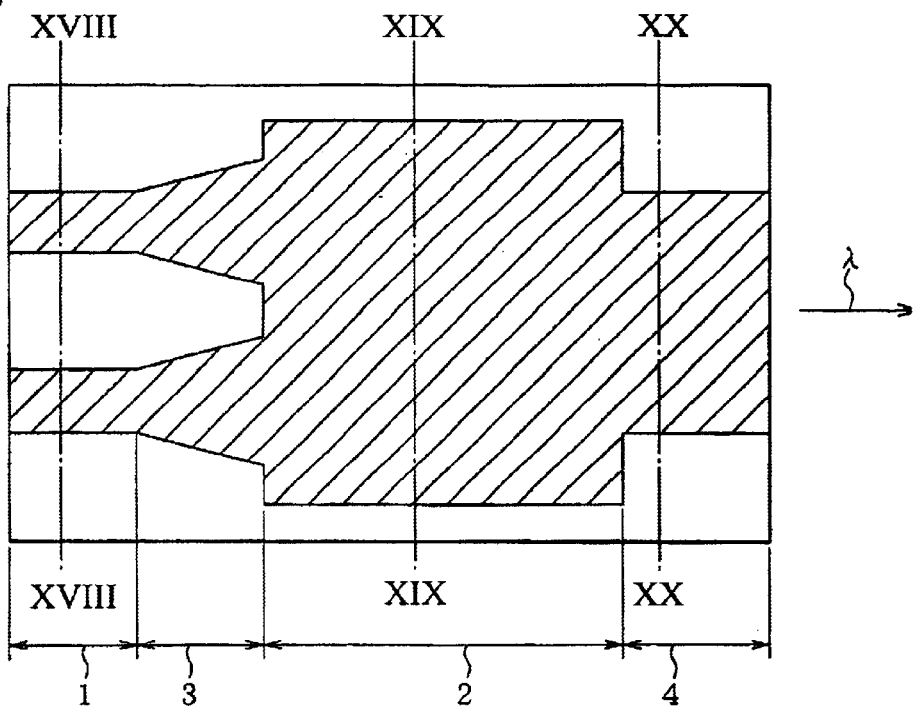
Figure 34:
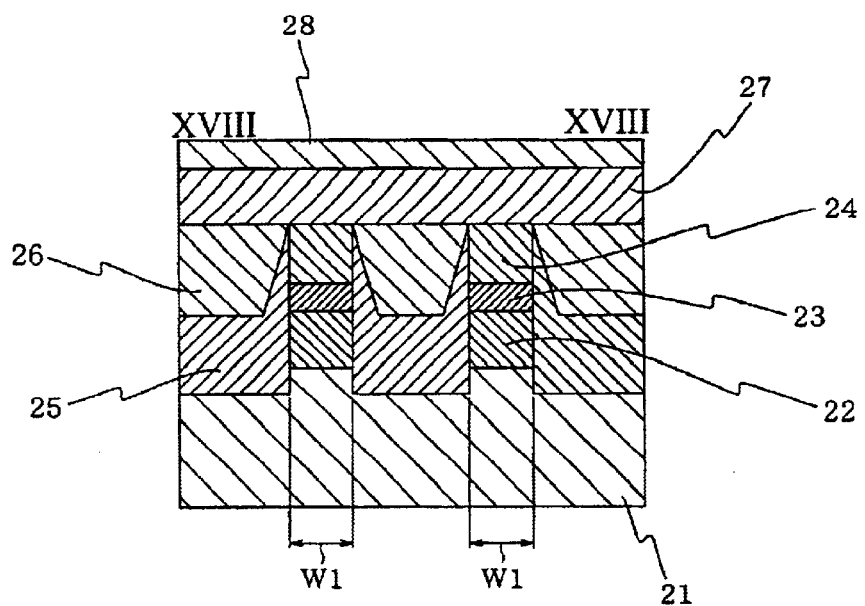
FIG. 34 is a cross sectional view about the line XVIII—XVIII in FIG. 33.
Figure 35:
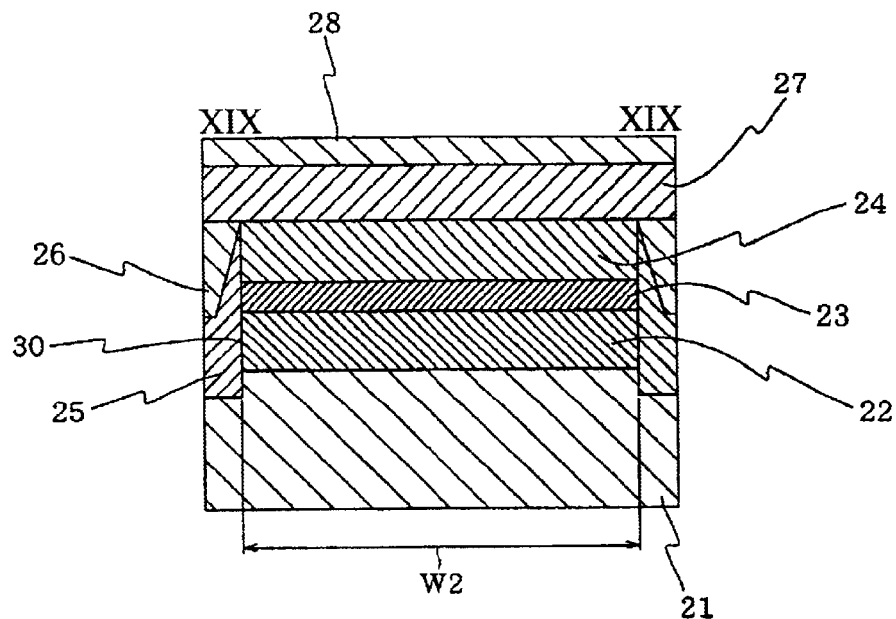
FIG. 35 is a cross sectional view about the line XIX—XIX in FIG. 33.
Figure 36:
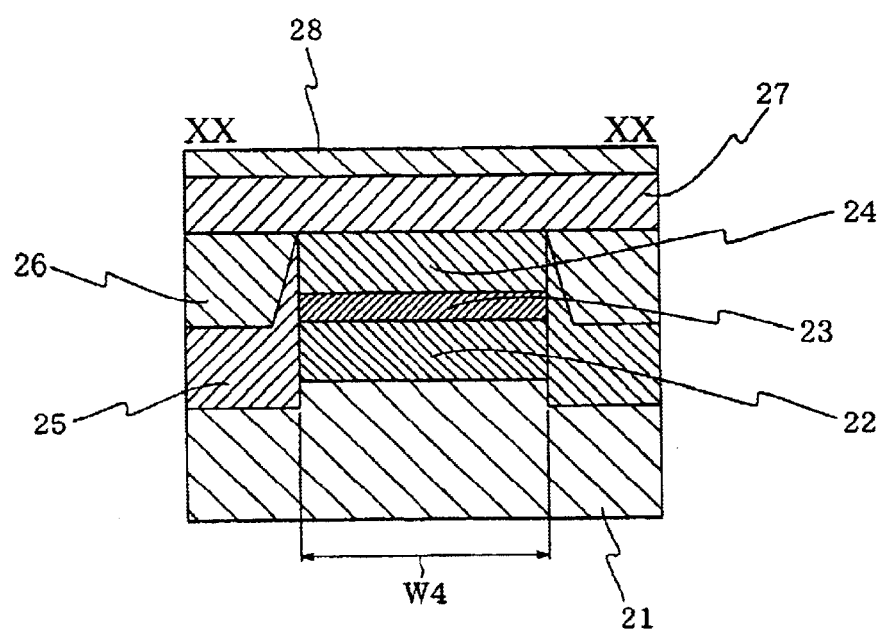
FIG. 36 is a cross sectional view about the line XX—XX in FIG. 33.

FIG. 33 to FIG. 36 show a semiconductor laser according to an eighth embodiment of the present invention. FIG. 33 is a plan view of the semiconductor laser according to the present embodiment, FIG. 34 is a cross sectional view about the line XVIII—XVIII in FIG. 33, FIG. 35 is a cross sectional view about the line XIX—XIX in FIG. 33, and FIG. 36 is a cross sectional view about the line XX—XX in FIG. 33. The semiconductor laser according to the present embodiment is a buried-heterostructure (BH) type and has a 1.55-micrometer band.

As shown in FIG. 33, the semiconductor laser according to the present embodiment includes: a first multi-mode waveguide 2 formed in a multi-mode waveguide region; a single mode waveguide 1 formed in a single mode waveguide region; a tapered waveguide 3 connecting the single mode waveguide 1 to the first multimode waveguide 2; and a second multi-mode waveguide 4 connected to the first multi-mode waveguide 2.

The first multi-mode waveguide 2 formed in the multi-mode waveguide region is designed as 1×2-MMI. Moreover, the second multi-waveguide 4 is designed as a 1×1-MMI.

The respective regions have length as follows: the 20 single mode waveguide 1 has a length of about 50 micrometers, the first multi-mode waveguide 2 has a length of about 460 micrometers, the tapered waveguide 3 has a length of about 50 micrometers, the second multi-mode waveguide 4 has a length of about 75 micrometers, and the entire length of the semiconductor laser is about 635 micrometers.

As shown in FIG. 34 to FIG. 36, the semiconductor laser according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and p-InP second cladding layer 27 and p$^+$-InGaAs cap layer 28 which are layered on the p-InP first cladding layer 24 and the n-InP current blocking layer 26.

As shown in FIG. 34 to FIG. 36, the active layer 23 is made from 1.55-micrometer composition InGaAsP and has a current confinement structure defined by the p-InP current blocking layer 25 and the n-InP current blocking layer 26.

The active layer 23 is covered by the p-InP first cladding layer 24, the p-InP second cladding layer 27 and the p-InGaAs cap layer 28.

As shown in FIG. 34 to FIG. 36, the p-InP current blocking layer 25 and the n-InP current blocking layer 26 are formed in such a manner that only the p-InP current blocking layer 25 is in contact with the side wall of the mesa 30, and the only the n-InP current blocking layer 26 is in contact with the p-InP second cladding layer 27.

A comparison of FIG. 34 with FIG. 35 and FIG. 36 clarifies that the difference between the single mode waveguide 1, the first multi-mode waveguide 2, and the second multi-mode waveguide 4 is only the waveguide width. As shown in FIG. 34, the single mode waveguide 1 has a waveguide width (W1) set to W1=2 micrometers, and as shown in FIG. 35, the first multi-mode waveguide 2 width (W2) is set to W2=20 micrometers. As for the tapered waveguide 3, its width is 2 micrometers, i.e., identical to the single mode waveguide 1, at the end coupled to the single mode waveguide 1 and the width at the end coupled to the first multi-mode waveguide 2 is W3=3.5 micrometers.

Moreover, as shown in FIG. 36, the second multi-mode waveguide 4 has a width (W4) set to W4=5 micrometers. This second multi-mode waveguide 4 is a multi-mode waveguide allowing the second mode and this second multi-mode waveguide 4 has a length of 75 micrometers, thus realizing the 1×1-MMI. structure The production method of the semiconductor laser according to the present embodiment is identical to the production method of the semiconductor laser according to the first embodiment.

The semiconductor laser according to the present embodiment is a laser oscillating a single mode, which can achieve a high output compared to a conventional single mode laser and improve the COD level. Furthermore, the semiconductor laser according to the present embodiment can improve the spatial hole burning compared to a conventional laser having using a multi-mode waveguide having a flare structure. Moreover, the semiconductor laser according to the present embodiment has an excellent mode stability and does not cause efficiency lowering due to a mode conversion loss. Furthermore, the semiconductor laser according to the present embodiment can improve coupling efficiency with an optical fiber. Hereinafter, explanation will be given on the principle explaining these merits.

The semiconductor laser according to the present embodiment is identical to the semiconductor laser according to the fourth embodiment except for that the second multi-mode region 4 is added.

Thus, the semiconductor laser according to the present embodiment includes the multi-mode waveguide 2 like the fourth embodiment and accordingly, can improve the gain saturation level of the active layer 23 compared to an ordinary single mode semiconductor laser.

Moreover, in the semiconductor laser according to the present embodiment, like in the fourth embodiment, the light output end is constituted by the end of the second multi-mode waveguide 4. This improves the COD (catastrophic optical damage) level compared to an ordinary semiconductor laser using a single mode waveguide.

Furthermore, in the semiconductor laser according to the present embodiment, its output mode can be controlled independently by the single mode waveguide 1, and no odd modes are excited. Accordingly, the spatial hole burning is not easily caused compared to the conventional semiconductor laser utilizing the multi-mode waveguide having the flare structure. This enables to realize a semiconductor laser having an excellent mode stability.

In addition to the aforementioned, the semiconductor laser according to the present embodiment uses the multi-mode waveguides 2 and 4 performing the MMI. operation and accordingly, no mode conversion loss is generated in principle. Accordingly, the semiconductor laser according to the present embodiment does not cause efficiency lowering as is observed in the conventional semiconductor laser utilizing the flare structure.

Furthermore, the semiconductor laser according to the present embodiment has such a structure that the tapered waveguide 3 is inserted between the single mode waveguide 1 and the first multi-mode waveguide 2. Accordingly, it is possible to reduce the coupling loss (though very little) between the single mode waveguide 1 and the first multi-mode waveguide 2 almost to 0 dB.

Moreover, the tapered waveguide 3 widens the optical field at the light output end of the multi-mode waveguide 2. As a result, the coupling efficiency with the single mode optical fiber is improved.

Moreover, in the semiconductor laser, according to the present embodiment, the light output end is constituted by the waveguide of 1×-MMI structure (the second multi-mode waveguide) 4 which is different from the first multi-mode waveguide 2. Accordingly, the tolerance for the cutting position is mitigated, facilitating a production procedure.

It should be noted that the first multi-mode waveguide 2 is designed in such a manner that no odd modes are excited. Accordingly, even if the second multi-mode waveguide 4 is used as a waveguide of the output side, only the single mode is output without deteriorating the mode stability.

Moreover, the layered configuration of the semiconductor laser according to the present embodiment is equivalent to the layered configuration of an ordinary semiconductor laser. Accordingly, like the first embodiment, the semiconductor laser according to the present embodiment can be produced by the same production procedure of the ordinary semiconductor laser. That is, the semiconductor laser according to the present embodiment can be produced comparatively easily by using only an established production method, i.e., with a high repeatability and yield. Moreover, since the semiconductor laser according to the present embodiment has a comparatively simple configuration, it can also be applied to an integrated optical device.

[Embodiment 9]

Figure 37:
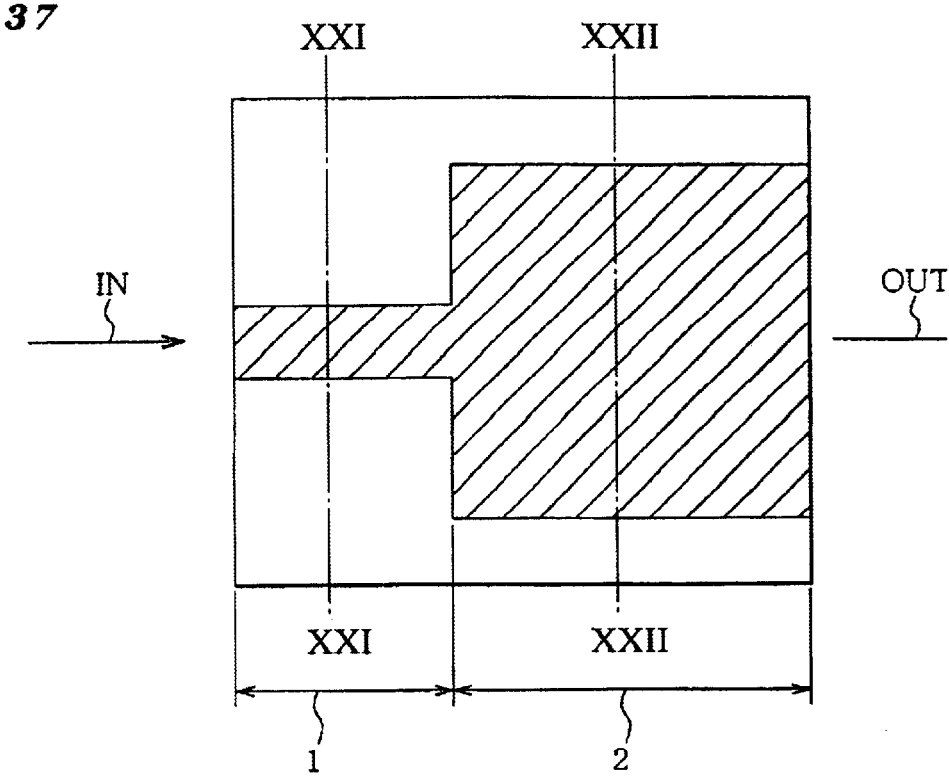
Figure 38:
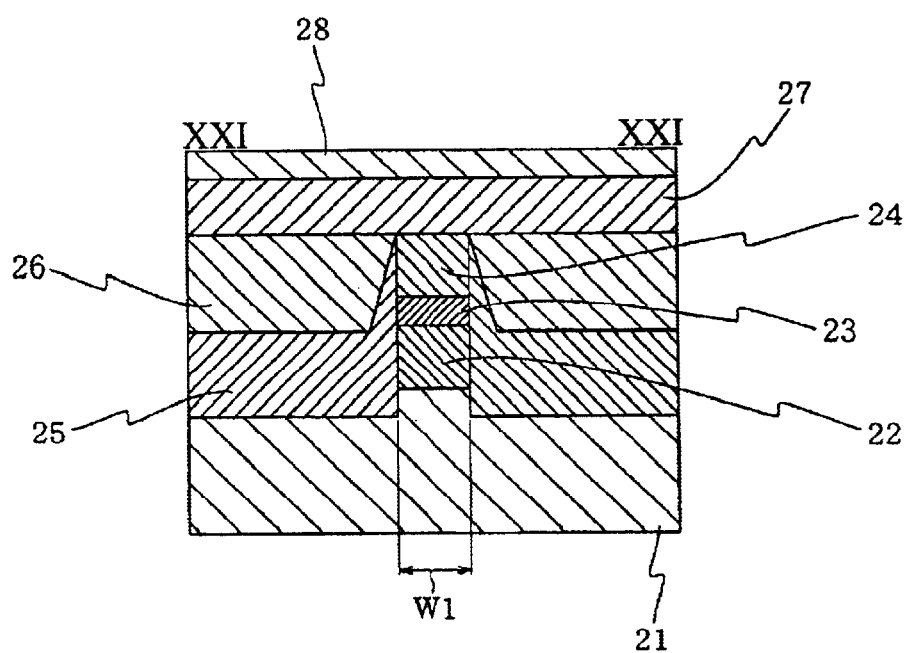
FIG. 38 is a cross sectional view about the line XXI—XXI in FIG. 37.
Figure 39:
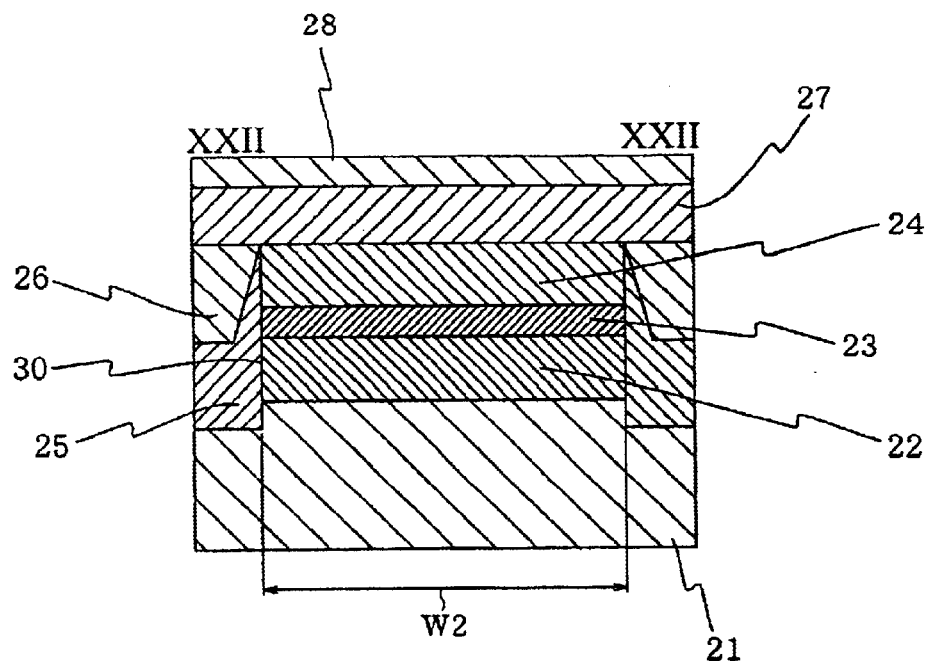
FIG. 39 is a cross sectional view about the line XXII—XXII in FIG. 37.

FIG. 37 to FIG. 39 show a semiconductor optical amplifier according to an ninth embodiment of the present invention. FIG. 37 is a plan view of the semiconductor optical amplifier according to the present embodiment, FIG. 38 is a cross sectional view about the line XXI—XXI in FIG. 37, and FIG. 39 is a cross sectional view about the line XXII—XXII in FIG. 37. The semiconductor optical amplifier according to the present embodiment is a buried-heterostructure (BH) type and has a 1.55-micrometer band.

As shown in FIG. 37, the semiconductor optical amplifier according to the present embodiment includes: a first multi-mode waveguide 2 formed in a multi-mode waveguide region; and a single mode waveguide 1 formed in a single mode waveguide region, which is connected to the first multi-mode waveguide 2.

The first multi-mode waveguide 2 formed in the multi-mode waveguide region is designed as 1×1-MMI. The respective regions have length as follows: the single mode waveguide 1 has a length of about 50 micrometers, and the first multi-mode waveguide 2 has a length of about 260 micrometers. The entire length of the semiconductor laser (sic) is about 310 micrometers.

As shown in FIG. 38 and FIG. 39, the semiconductor 10 optical amplifier according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and p-InP second cladding layer 27 and p$^+$-InGaAs cap layer 28 which are layered on the p-InP first cladding layer 24 and the n-InP current blocking layer 26.

As shown in FIG. 38 and FIG. 39, the active layer 23 is made from 1.55-micrometer composition InGaAsP and has a current confinement structure defined by the p-InP current blocking layer 25 and the n-InP current blocking layer 26.

The active layer 23 is covered by the p-InP first cladding layer 24, the p-InP second cladding layer 27 and the p$^+$-InGaAs cap layer 28.

As shown in FIG. 38 and FIG. 39, the p-InP current blocking layer 25 and the n-InP current blocking layer 26 are formed in such a manner that only the p-InP current blocking layer 25 is in contact with the side wall of the mesa 30, and only the n-InP current block layer 26 is in contact with the p-InP second cladding layer 27.

A comparison of FIG. 38 with FIG. 39 clarifies that the difference between the single mode waveguide 1 and the first multi-mode waveguide 2 is only the waveguide width. As shown in FIG. 38, the single mode waveguide 1 has a waveguide width (W1) set to W1=2 micrometers, and as shown in FIG. 39, the first multi-mode waveguide 2 width (W2) is set to W2=10 micrometers.

Hereinafter, referring to FIG. 4 to FIG. 7, explanation will be given on a production method of the semiconductor optical amplifier according to the present embodiment. Firstly, as shown in FIG. 4, the n-InP substrate 21 is successively covered with the n-InP buffer layer 22, the active layer 23 made from 1.55-micrometer composition InGaAsP, and the p-InP first cladding layer 24, using the MOVPE technique.

The respective layers have thickness values as follows; the n-InP buffer layer is set to about 100 nm, the 1.55-micrometer InGaAsP active layer 23 is set to about 100 nm, and the p-InP first cladding layer 24 is set to about 100 nm.

Next, the ordinary photolithography technique and wet etching method are used to form a mesa-shaping mask 31 on the p-InP first cladding layer 24.

Next, as shown in FIG. 5, the reactive ion etching (RIE) technique is used to remove a portion of the p-InP first cladding layer 24, the 1.55-micrometer InGaAsP active layer 23, the n-InP buffer layer 22, and the n-InP substrate 21, thus forming a mesa 30.

Next, as shown in FIG. 6, using the MOVPE technique, the p-InP current blocking layer 25 and the p-InP current blocking layer 26 are formed around the mesa 30. These current blocking layers 25 and 26 are formed in such a manner that only the p-InP current blocking layer 25 is in contact with the side wall of the mesa and only the n-InP current blocking layer 26 is exposed outside.

Each of the p-InP current blocking layer 25 and the n-InP current blocking layer 26 has a thickness of about 1 micrometer.

Next, the mesa-shaping mask 31 is removed by buffered hydrofluoric acid.

After this, as shown in FIG. 7, the p-InP first cladding layer 24 and the n-InP current blocking layer 26 are covered with the p-InP second cladding layer 27 and then with the p$^+$-InGaAs cap layer 28 using the MOVPE technique.

Next, the back surface of the n-InP substrate 21 is polished. Next, a rear electrode and a front electrode are formed using the ordinary sputtering method.

After an element is cleaved, the cleaved end is coated with an anti-reflective (AR) coating.

Thus, production procedure of the embodied semiconductor laser according to the present embodiment is completed.

The semiconductor optical amplifier according to the present embodiment is a semiconductor optical amplifier for outputting a single mode, which can achieve a high gain and high saturation output compared to a conventional single mode optical amplifier and improve the COD level. Furthermore the semiconductor optical amplifier according to the present embodiment can improve the spatial hole burning compared to a conventional laser using a multi-mode waveguide having a flare structure. Moreover, the semiconductor optical amplifier has an excellent mode stability and does not cause efficiency lowering due to a mode conversion loss.

Hereinafter, explanation will be given on the principle explaining these merits.

As shown in FIG. 37, the semiconductor optical amplifier according to the present embodiment is designed as a 1×1-MMI. having a first multi-mode waveguide 2. That is, the first multi-mode waveguide 2 is a quasi-single mode waveguide, i.e., although being a multi-mode waveguide, only a single mode light propagates at both ends.

Thus, the semiconductor optical amplifier includes a multi-mode waveguide, which improves a gain saturation level of the active layer 23, achieving a high saturation gain and a high saturation output compared to an ordinary single mode semiconductor optical amplifier.

Moreover, in the semiconductor optical amplifier according to the present embodiment, its light output end is constituted by the wide first multi-mode waveguide 2.

Accordingly, when compared to an ordinary single mode semiconductor laser, the light density at the light output end is reduced for the same light output, thus improving the COD level.

Furthermore, in the semiconductor optical amplifier according to the present embodiment, its output mode can be controlled independently by the single mode waveguide 1 and structurally no odd modes are excited. Accordingly the spatial hole burning is not easily generated compared to the conventional semiconductor optical amplifier. Thus, it is possible to realize a semiconductor optical amplifier having an excellent mode stability.

Additionally, since the semiconductor optical amplifier according to the present embodiment employs the multimode waveguide 2 performing the MMI. operation, no mode conversion loss is generated in principle. Accordingly, the effect lowering observed in the conventional semiconductor optical amplifier is not caused.

Moreover, the layered configuration of the semiconductor optical amplifier according to the present embodiment is equivalent to the layered configuration of an ordinary semiconductor optical amplifier. Accordingly, the semiconductor optical amplifier according to the present embodiment can be produced by the same production procedure of the ordinary semiconductor optical amplifier. That is, the semiconductor optical amplifier according to the present embodiment can be produced comparatively easily by using only the established production method, i.e., with a high repeatability and yield.

Moreover, since the semiconductor optical amplifier according to the present embodiment has a comparatively simple configuration, it can also be applied to an integrated optical device.

It should be noted that in the present embodiment and in the tenth to twelfth embodiments which will be detailed later, the semiconductor optical amplifier has a simple buried-heterostructure (BH structure). However, the present embodiment and the tenth to twelfth embodiments are not to be limited to the buried-heterostructure. For example, the present embodiment and the tenth to twelfth embodiments can be applied to a ridge structure or DC-PBH structure having an excellent current confinement.

Moreover, in the present embodiment, the laser wavelength 10 is set to a 1.55-micrometer band but not to be limited to this band. For example, the laser wavelength may be a visible light band or a 0.98-micrometer band or other near infrared light band.

Furthermore, the active layer 23 in the present embodiment 15 has a bulk structure, but the active layer 23 may have a multi-quantum well (MQW) structure.

As for the production method, in the present embodiment and the tenth to twelfth embodiments, the MOVPE technique is used for crystal growth and the RIE technique is used for formation of the mesa 30. However, the embodiments are not to be limited to these techniques. For example, the MBE technique can be used for the crystal growth and the wet etching can be used for formation of the mesa 30.

[Embodiment 10]

Figure 40:
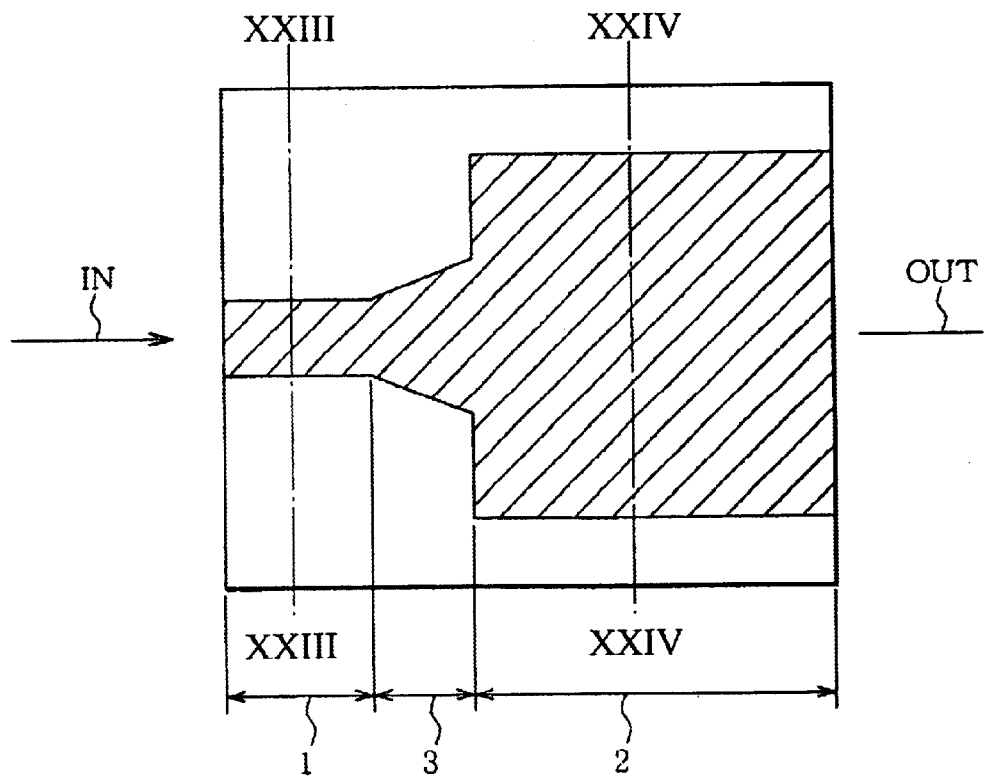
Figure 41:
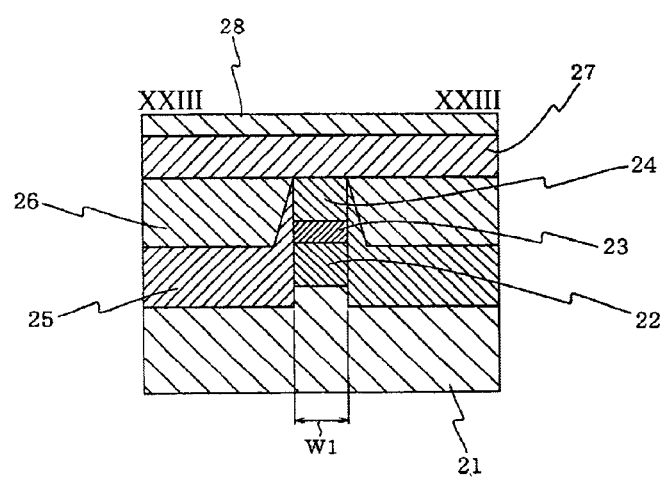
FIG. 41 is a cross sectional view about the line XXIII—XXIII in FIG. 40.
Figure 42:
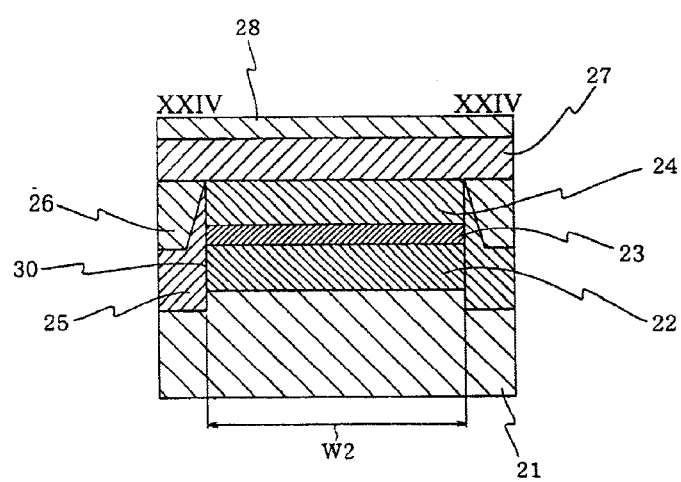
FIG. 42 is a cross sectional view about the line XXIV—XXIV in FIG. 40.

FIG. 40 to FIG. 42 show a semiconductor optical amplifier according to a tenth embodiment of the present invention. FIG. 40 is a plan view of the semiconductor optical amplifier according to the present embodiment. FIG. 41 is a cross sectional view about the line XXIII—XXIII in FIG. 40 and FIG. 42 is a cross sectional view about the line XXIV—XXIV in FIG. 40. The semiconductor optical amplifier according to the present embodiment has a buried-heterostructure (BH) and a 1.55-micrometer band.

As shown in FIG. 40, the semiconductor optical amplifier according to the present embodiment includes: a first multi-mode waveguide 2 formed in a multi-mode waveguide region; a single mode waveguide 1 formed at the light incident side of the first multi-mode waveguide 2 in a single mode waveguide region; and a tapered waveguide 3 connecting the single mode waveguide 2 to the first multimode waveguide 2.

The first multi-mode waveguide 2 formed in the multi-mode waveguide region is constituted as 1×1-MMI.

The respective regions have length as follows: length of the single mode waveguide 1 is about 50 micrometers, length of the first multi-mode waveguide 2 is about 260 micrometers, length of the tapered waveguide 3 is about 50 micrometers, and the entire length of the semiconductor optical amplifier is about 360 micrometers.

As shown in FIG. 41 and FIG. 42, the semiconductor optical amplifier according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and a p-InP second cladding layer 27 and a p$^+$-InGaAs cap layer 28 which are layered on the p-InP first cladding layer 24 and the n-InP current blocking layer 26.

As shown in FIG. 41 and FIG. 42, the active layer 23 is made from 1.55-micrometer composition InGaAsP and has a current confinement structure defined by the p-InP current blocking layer 25 and the n-InP current blocking layer 26. The active layer 23 is covered by the p-InP first cladding layer 24, the p$^+$-InP second cladding layer 27 and the p-InGaAs cap layer 28.

As shown in FIG. 41 and FIG. 42, the p-InP current blocking layer 25 and the n-InP current blocking layer 26 are formed in such a manner that only the p-InP current blocking layer 25 is in contact with the side wall of the mesa 30, and only the n-InP current blocking layer 26 is in contact with the p-InP second cladding layer 27.

A comparison of FIG. 41 with FIG. 42 clarifies that the difference between the single mode waveguide 1 and the first multi-mode waveguide 2 is only the waveguide width. As shown in FIG. 41, the single mode waveguide 1 has a waveguide width (W1) set to W1=2 micrometers, and as shown in FIG. 42, the first multi-mode waveguide 2 width (W2) is set to W2=10 micrometers. As for the tapered waveguide, its width is 2 micrometers, i.e., identical to the single mode waveguide 1, at the end coupled to the single mode waveguide 1 and the width at the end coupled to the first multi-mode waveguide 2 is W3=3.5 micrometers.

The production method of the semiconductor optical amplifier according to the present embodiment is identical to the production method of the semiconductor optical amplifier according to the ninth embodiment.

The semiconductor optical amplifier according to the present embodiment is an optical amplifier outputting a single mode which can achieve a high output compared to a conventional single mode optical amplifier and improve the COD level.

Furthermore, the semiconductor optical amplifier according to the present embodiment can improve the spatial hole burning compared to a conventional optical amplifier using a multi-mode waveguide having a flare structure.

Moreover, the semiconductor optical amplifier has an excellent mode stability and does not cause efficiency lowering due to a mode conversion loss. Hereinafter, explanation will be given on the principle explaining these merits.

As shown in FIG. 40, the semiconductor optical amplifier according to the present embodiment, compared to the semiconductor optical amplifier according to the ninth embodiment, has a tapered waveguide region 3 between the single mode waveguide 1 and the first multi-mode waveguide 2.

Accordingly, the first multi-mode waveguide 2, although being a multi-mode waveguide, constitutes a quasi-single mode waveguide in which only a single mode light propagates at both ends.

Thus, like the ninth embodiment, the semiconductor 15 optical amplifier according to the present embodiment has a structure including the multi-mode waveguide 2 and accordingly, it is possible to improve the gain saturation level of the active layer 23 compared to an ordinary single mode semiconductor optical amplifier. As a result, it is possible to obtain a high saturation gain and a high saturation output.

Moreover, in the semiconductor optical amplifier according to the present embodiment, like in the ninth embodiment, the light output end is constituted by the end of the multi-mode waveguide 2. This improves the COD (catastrophic optical damage) level compared to an ordinary semiconductor optical amplifier using a single mode waveguide.

Furthermore, in the semiconductor optical amplifier according to the present embodiment, its output mode can be controlled independently by the single mode waveguide 1, and structurally no odd modes are excited. Accordingly, the spatial hole burning is not easily caused compared to the conventional semiconductor optical amplifier utilizing the multi-mode waveguide having the flare structure. This enables to realize a semiconductor optical amplifier having an excellent mode stability.

In addition to the aforementioned, the semiconductor 15 optical amplifier according to the present embodiment uses the multi-mode waveguide 2 performing the MMI. operation and accordingly, no mode conversion loss is generated in principle. Accordingly, the semiconductor optical amplifier according to the present embodiment does not cause efficiency lowering as is observed in the conventional semiconductor optical amplifier utilizing the flare structure.

Furthermore, the semiconductor optical amplifier according to the present embodiment has such a structure that the tapered waveguide 3 is inserted between the single mode waveguide 1 and the multi-mode waveguide 2. Accordingly, it is possible to reduce the coupling loss (though very little) between the single mode waveguide 1 and the first multi-mode waveguide 2 almost to 0 dB.

It should be noted that in the present embodiment, although the tapered waveguide 3 is implemented, the region of the waveguide 3 is very small. Accordingly, almost no mode conversion loss is caused and the mode stability can be maintained by the no odd mode pumping condition in the MMI. region.

Moreover, the tapered waveguide 3 widens the optical field at the light output end of the multi-mode waveguide 2. As a result, the coupling efficiency with the single mode optical fiber is improved.

Moreover, the layered configuration of the semiconductor optical amplifier according to the present embodiment is equivalent to the layered configuration of an ordinary semiconductor optical amplifier. Accordingly, like the ninth embodiment, the semiconductor optical amplifier according to the present embodiment can be produced by the same production procedure of the ordinary semiconductor optical amplifier. That is, the semiconductor optical amplifier according to the present embodiment can be produced comparatively easily by using only the established production method, i.e., with a high repeatability and yield.

Moreover, since the semiconductor optical amplifier according to the present embodiment has a comparatively simple configuration, it can also be applied to an integrated 5 optical device.

[Embodiment 11]

Figure 43:
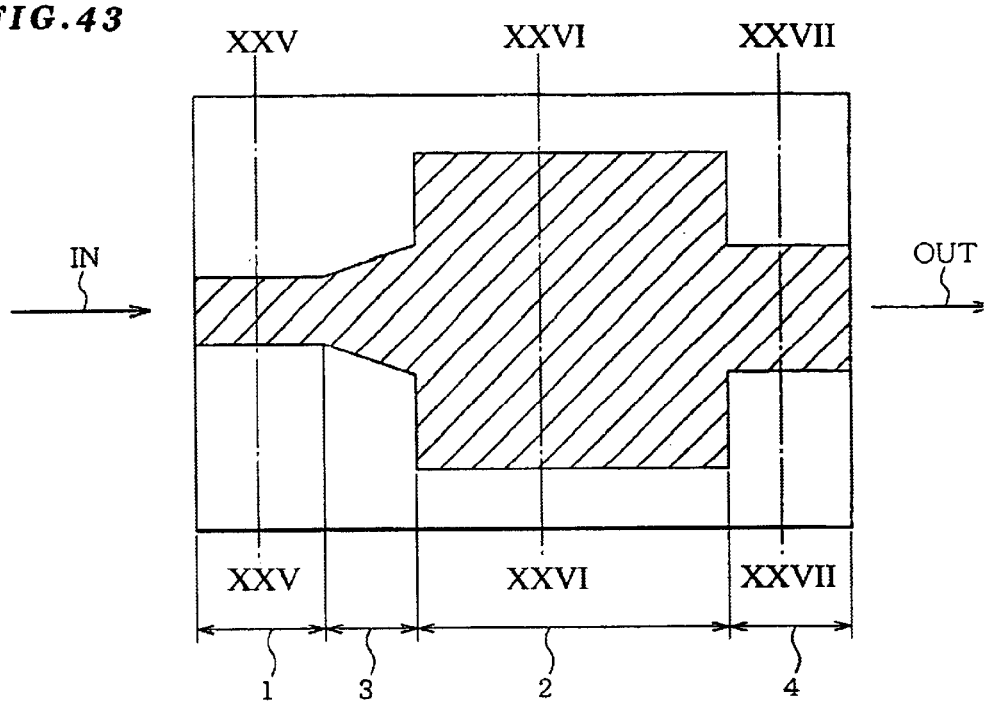
Figure 44:
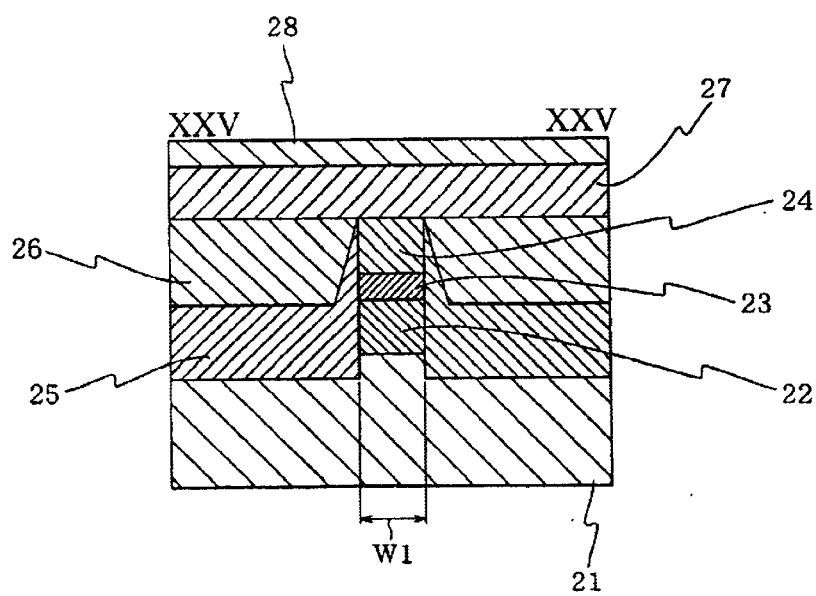
FIG. 44 is a cross sectional view about the line XXV—XXV in FIG. 43.
Figure 45:
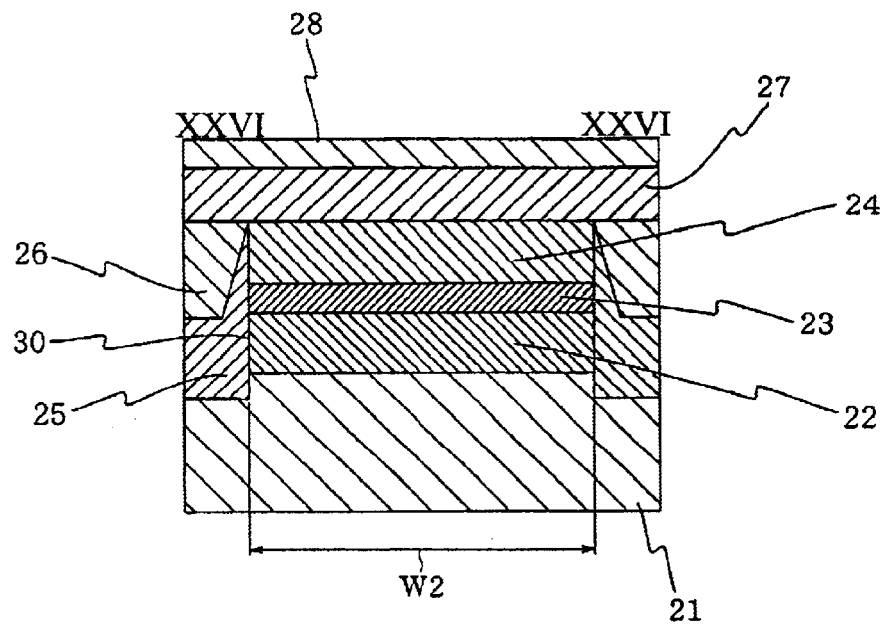
FIG. 45 is a cross sectional view about the line XXVI—XXVI in FIG. 43.
Figure 46:
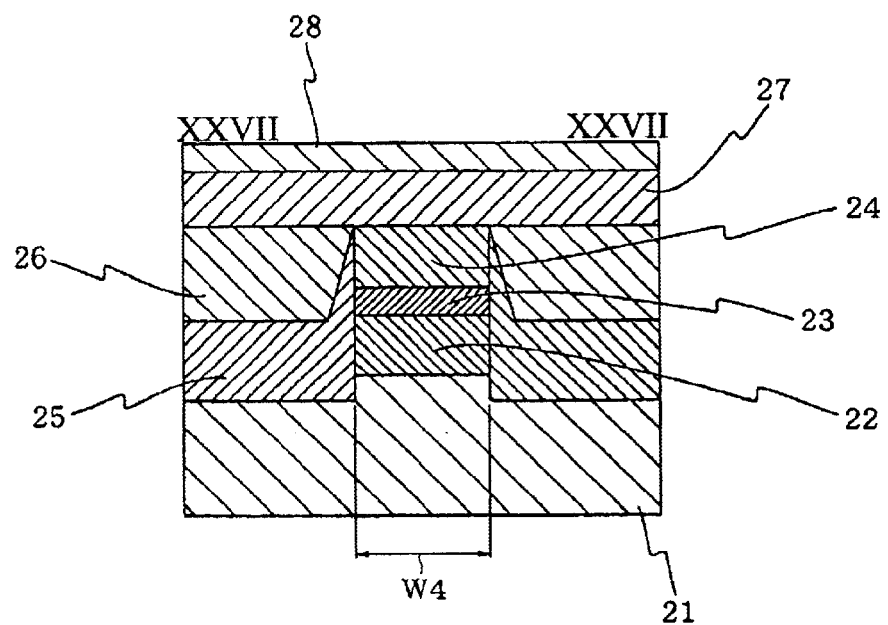
FIG. 46 is a cross sectional view about the line XXVII—XXVII in FIG. 43.

FIG. 43 to FIG. 46 show a semiconductor optical amplifier according to an eleventh embodiment of the present invention. FIG. 43 is a plan view of the semiconductor optical amplifier according to the present embodiment, FIG. 44 is a cross sectional view about the line XXV—XXV in FIG. 43, FIG. 45 is a cross sectional view about the line XXVI—XXVI in FIG. 43, and FIG. 46 is a cross sectional view about the line XXVII—XXVII in FIG. 43. The semiconductor optical amplifier according to the present embodiment is a buried-heterostructure (BH) type and has a 1.55-micrometer band.

As shown in FIG. 43, the semiconductor optical amplifier according to the present embodiment includes: a first multi-mode waveguide 2 formed in a multi-mode waveguide region; a single mode waveguide 1 formed at in a single mode waveguide region; a tapered waveguide 3 connecting the single mode waveguide 1 to the first multimode waveguide 2.

The first multi-mode waveguide 2 formed in the multi-mode waveguide region is constituted as a 1×1-MMI. Moreover, the second multi-waveguide region 4 is designed as a secondary mode cleaved waveguide.

The respective regions have length as follows: the single mode waveguide 1 has a length of about 50 micrometers, the first multi-mode waveguide 2 has a length of about 260 micrometers, the tapered waveguide 3 has a length of about 50 micrometers, the second multi-mode waveguide 4 has a length of about 50 micrometers, and the entire length of the semiconductor optical amplifier is about 410 micrometers.

As shown in FIG. 44 to FIG. 46, the semiconductor optical amplifier according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and p-InP second cladding layer 27 and p$^+$-InGaAs cap layer 28 which are layered on the p-InP first cladding layer 24 and the n-InP current blocking layer 26.

As shown in FIG. 44 to FIG. 46, the active layer 23 is made from 1.55-micrometer composition InGaAsP and has a current confinement structure defined by the p-InP current blocking layer 25 and the n-InP current blocking layer 26.

The active layer 23 is covered by the p-InP first cladding layer 24, the p-InP second cladding layer 26 and the p+-InGaAs cap layer.

As shown in FIG. 44 to FIG. 46, the p-InP current blocking layer and the n-InP current blocking layer are formed in such a manner that only the p-InP current blocking layer 25 is in contact with the side wall of the mesa 30, and the only the n-InP current blocking layer is in contact with the p-InP second cladding layer 27.

A comparison of FIG. 44 with FIG. 45 and FIG. 46 clarifies that the difference between the single mode waveguide 1, the first multi-mode waveguide 2, and the second multi-mode waveguide is only the waveguide width. As shown in FIG. 44, the single mode waveguide 1 has a waveguide with (W1) set to W1=2 micrometers, and as shown in FIG. 45, the first multi-mode waveguide with (W2) is set to W2=10 micrometers. As for the tapered waveguide 3, its width is 2 micrometers, i.e., identical to the single mode waveguide 1, at the end coupled to the single mode waveguide 1 and the width at the end coupled to the first multi-mode waveguide 2 is W3=3.5 micrometers. Moreover, as shown in FIG. 46, the second multi-mode waveguide 4 has a width (W4) set to W4=3.5 micrometers.

The production method of the semiconductor optical amplifier according to the present embodiment is identical to the production method of the semiconductor optical amplifier according to the ninth embodiment.

The semiconductor optical amplifier according to the present embodiment is an optical amplifier oscillating a single mode, which can achieve a high gain and a high saturation output compared to a conventional single mode optical amplifier and improve the COD level. Furthermore, the semiconductor optical amplifier according to the present embodiment can improve the spatial hole burning compared to a conventional semiconductor optical amplifier using a multi-mode waveguide having a flare structure. Moreover, the semiconductor optical amplifier according to the present embodiment has an excellent mode stability and does not cause efficiency lowering due to a mode conversion loss. Hereinafter, explanation will be given on the principle explaining these merits.

The semiconductor optical amplifier according to the present embodiment is identical to the semiconductor optical amplifier according to the tenth embodiment except for that the second multi-mode region 4 is added.

Thus, like the tenth embodiment, the first multi-mode waveguide 2, being a multi-mode waveguide, serves as a quasi-single mode waveguide in which only the single mode light propagates at both ends.

Thus, the semiconductor optical amplifier according to the present embodiment, like the tenth embodiment, includes the multi-mode waveguide 2 and accordingly, can improve the gain saturation level of the active layer 23 compared to an ordinary single mode semiconductor optical amplifier. As a result, it is possible to obtain a high saturation gain and a high saturation output.

Moreover, in the semiconductor optical amplifier according to the present embodiment like in the ninth embodiment, the light output end is constituted by the end of the multi-mode waveguide 2. This improves the COD (catastrophic optical damage) level compared to an ordinary semiconductor optical amplifier using a single mode waveguide.

Furthermore, in the semiconductor optical amplifier according to the present embodiment, its output mode can be controlled independently by the single mode waveguide 1, and structurally no odd modes are excited. Accordingly, the spatial hole burning is not easily caused compared to the conventional semiconductor optical amplifier utilizing the multi-mode waveguide having the flare structure as shown. This enables to realize a semiconductor optical amplifier having an excellent mode stability.

In addition to the aforementioned, the semiconductor optical amplifier according to the present embodiment uses the multi-mode waveguides 2 and 4 performing the MMI. operation and accordingly, no mode conversion loss is generated in principle. Accordingly, the semiconductor laser according to the present embodiment does not cause efficiency lowering as is observed in the conventional semiconductor laser utilizing the flare structure.

Furthermore, the semiconductor optical amplifier according to the present embodiment has such a structure that the tapered waveguide 3 is inserted between the single mode waveguide 1 and the first multi-mode waveguide 2. Accordingly, it is possible to reduce the coupling loss (though very little) between the single mode waveguide 1 and the first multi-mode waveguide 2 almost to 0 dB.

It should be noted that in the present embodiment, although the tapered waveguide 3 is implemented, the region of the waveguide 3 is very small. Accordingly, almost no mode conversion loss is caused and the mode stability can be maintained by the no odd mode pumping condition in the MMI. 20 region.

Moreover, the tapered waveguide 3 widens the optical field at the light output end of the multi-mode waveguide 2. As a result, the coupling efficiency with the single mode optical fiber is improved.

Moreover, in the semiconductor optical amplifier according to the present embodiment, the light output end is constituted by the second mode cleaved waveguide (second multi-mode waveguide) 4 which is different from the first multi-mode waveguide 2. Accordingly, the tolerance for the cutting position is mitigated, facilitating a production procedure.

It should be noted that since the first multi-mode waveguide 2 is designed in such a manner that no odd modes are excited. Accordingly, even if the second multi-mode waveguide 4 is used as a waveguide of the output side, only the single mode is output without deteriorating the mode stability.

Moreover, the layered configuration of the semiconductor optical amplifier according to the present embodiment is equivalent to the layered configuration of an ordinary semiconductor laser. Accordingly, like the ninth embodiment, the semiconductor optical amplifier according to the present embodiment can be produced by the same production procedure of the ordinary semiconductor laser.

That is, the semiconductor laser according to the present embodiment can be produced comparatively easily by using only an established production method, i.e., with a high repeatability and yield.

Moreover, since the semiconductor optical amplifier according to the present embodiment has a comparatively simple configuration, it can also be applied to an integrated optical device.

[Embodiment 12]

Figure 47:
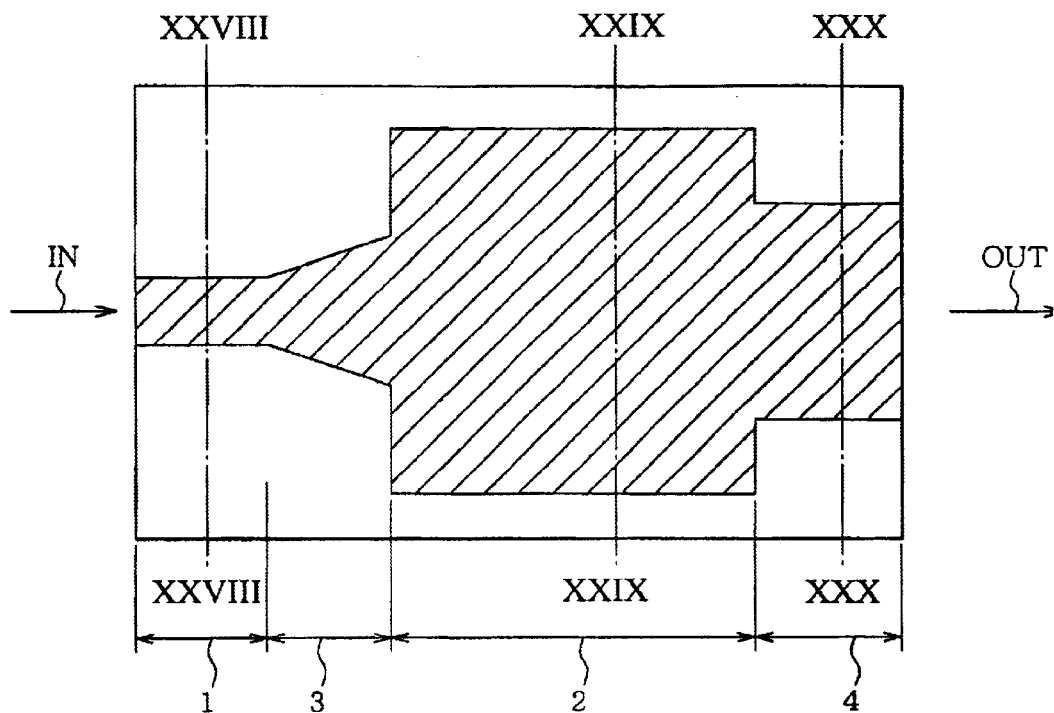
Figure 48:
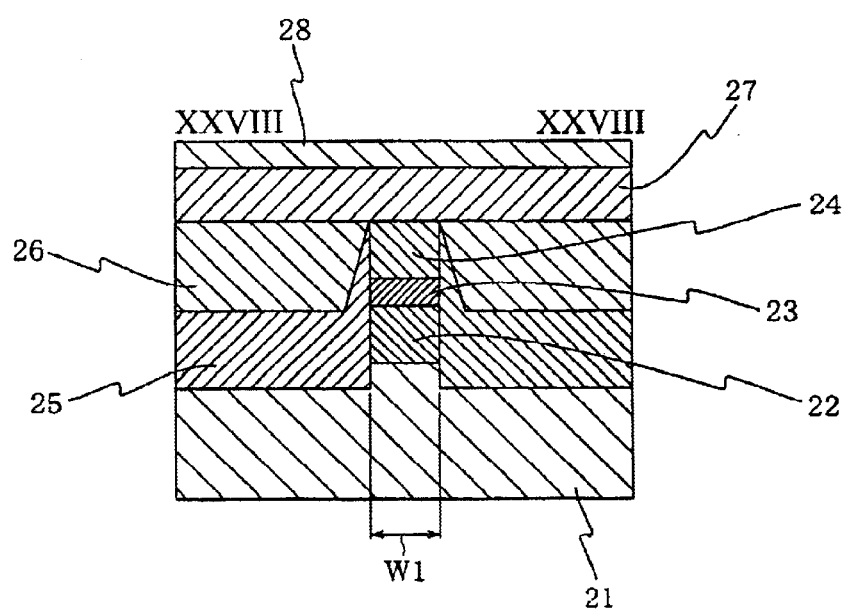
FIG. 48 is a cross sectional view about the line XXVIII—XXVIII in FIG. 47.
Figure 49:
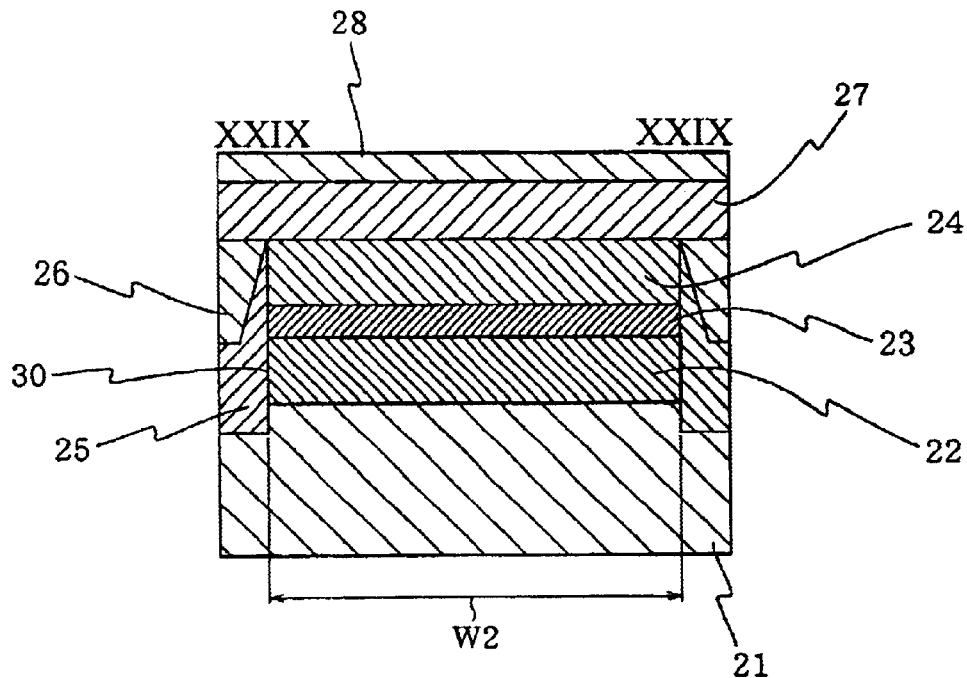
FIG. 49 is a cross sectional view about the line XXIX—XXIX in FIG. 47.
Figure 50:
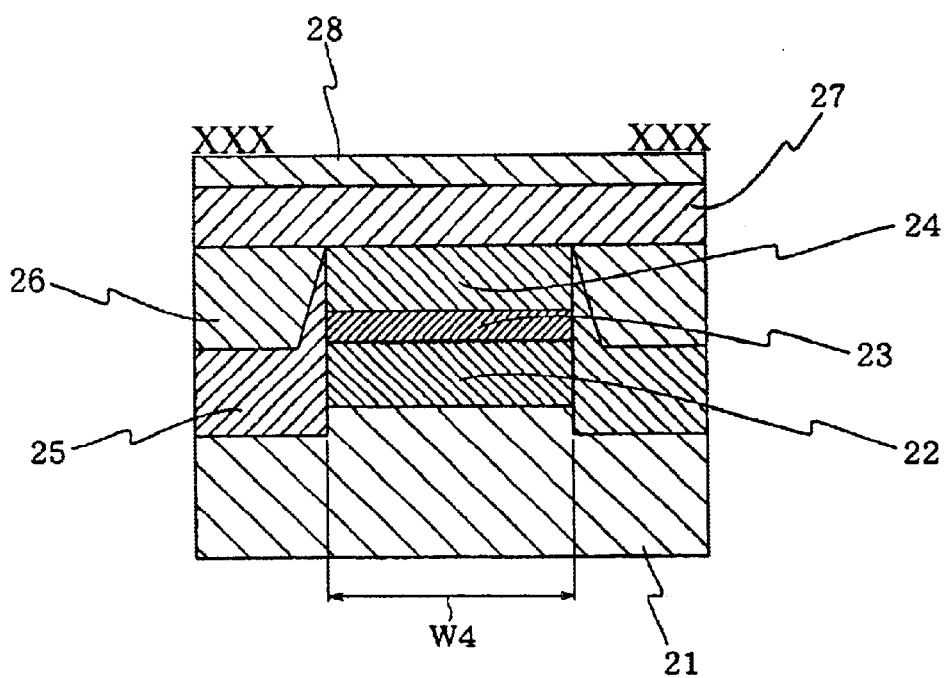
FIG. 50 is a cross sectional view about the line XXX—XXX in FIG. 47.

FIG. 47 to FIG. 50 show a semiconductor optical amplifier according to a twelfth embodiment of the present invention. FIG. 47 is a plan view of the semiconductor laser according to the present embodiment, FIG. 48 is a cross sectional view about the line XXVIII—XXVIII in FIG. 47, FIG. 49 is a cross sectional view about the line XXIX—XXIX in FIG. 47, and FIG. 50 is a cross sectional view about the line XXX—XXX in FIG. 47. The semiconductor optical amplifier according to the present embodiment is a buried-heterostructure (BH) type and has a 1.55-micrometer band.

As shown in FIG. 47, the semiconductor optical amplifier according to the present embodiment includes: a first multi-mode waveguide 2 formed in a multi-mode waveguide region; a single mode waveguide 1 formed at in a single mode waveguide region; a tapered waveguide 3 connecting the single mode waveguide 2 to the first multimode waveguide 2; and a second multi-mode waveguide 4 formed to be coupled to the first multi-mode waveguide 2 at the light incident side of the first multi-mode waveguide 2.

Each of the first multi-mode waveguide 2 and the second multi-waveguide 4 is designed as a 1×1-MMI.

The respective regions have length as follows: the single mode waveguide 1 has a length of about 50 micrometers, the first multi-mode waveguide 2 has a length of about 260 micrometers, the tapered waveguide 3 has a length of about 50 micrometers, the second multi-mode waveguide 4 has a length of about 75 micrometers, and the entire length of the semiconductor optical amplifier is about 435 micrometers.

As shown in FIG. 48 to FIG. 50, the semiconductor optical amplifier according to the present embodiment includes: an n-InP substrate 21 having a protruding portion; an n-InP buffer layer 22, an active layer 23, and a p-InP first cladding layer 24 which are formed in a mesa shape on the protruding portion of the n-InP substrate 21; a p-InP current blocking layer 25 and an n-InP current blocking layer 26 layered around the mesa 30; and p-InP second cladding layer 27 and p$^+$-InGaAs cap layer 28 which are layered on the p-InP first cladding layer 24 and the n-InP current blocking layer 26.

As shown in FIG. 48 to FIG. 50, the active layer 23 is made from 1.55-micrometer composition InGaAsP and has a current confinement structure defined by the p-InP current blocking layer 25 and the n-InP current blocking layer 26. The active layer 23 is covered by the p-InP first cladding layer 24, the p-InP second cladding layer 27 and the p$^+$-InGaAs cap layer.

As shown in FIG. 48 to FIG. 50, the p-InP current blocking layer 25 and the n-InP current blocking layer 26 are formed in such a manner that only the p-InP current blocking layer 25 is in contact with the side wall of the mesa 30, and the only the n-InP current blocking layer is in contact with the p-InP second cladding layer 27.

A comparison of FIG. 48 with FIG. 49 and FIG. 50 clarifies that the difference between the single mode waveguide 1, the first multi-mode waveguide 2, and the second multi-mode waveguide is only the waveguide width. As shown in FIG. 48, the single mode waveguide 1 has a waveguide width (W1) set to W1 2 micrometers, and as shown in FIG. 49, the first multi-mode waveguide 2 width (W2) is set to W2=10 micrometers.

As for the tapered waveguide 3, its width is 2 micrometers, i.e. identical to the single mode waveguide 1, at the end coupled to the single mode waveguide 1 and the width at the end coupled to the first multi-mode waveguide 2 is W3=3.5 micrometers.

Moreover, as shown in FIG. 50, the second multi-mode waveguide 4 has a width (W4) set to W4=5 micrometers. This second multi-mode waveguide 4 is a multi-mode waveguide allowing the second mode and this second multi-mode waveguide 4 has a length of 75 micrometers, thus realizing the 1×1-MMI structure.

The production method of the semiconductor optical amplifier according to the present embodiment is identical to the production method of the semiconductor optical amplifier according to the ninth embodiment.

The semiconductor optical amplifier according to the present embodiment is a laser oscillating a single mode, which can achieve a high output compared to a conventional single mode optical amplifier and improve the COD level. Furthermore, the semiconductor optical amplifier according to the present embodiment can improve the spatial hole burning compared to a conventional laser (sic) using a multi-mode waveguide having a flare structure. Moreover, the semiconductor optical amplifier according to the present embodiment has an excellent mode stability and does not cause efficiency lowering due to a mode conversion loss. Furthermore, the semiconductor optical amplifier according to the present embodiment can improve coupling efficiency with an optical fiber. Hereinafter, explanation will be given on the principle explaining these merits.

The semiconductor optical amplifier according to the present embodiment is identical to the semiconductor optical amplifier according to the tenth embodiment except for that the second multi-mode region 4 is added.

Accordingly, like the tenth embodiment, the first multi-mode waveguide 2, being a multi-mode waveguide, serves as a quasi-single mode waveguide in which only a single mode light propagates at both ends.

Thus, like the tenth embodiment, the semiconductor laser according to the present embodiment includes the multi-mode waveguide 2 and accordingly, can improve the gain saturation level of the active layer 23 compared to an ordinary single mode semiconductor laser. As a result, it is possible to obtain a high saturation gain and a high saturation output.

Moreover, in the semiconductor laser according to the present embodiment, like in the ninth embodiment, the light output end is constituted by the end of the multi-mode waveguide 2. This improves the COD (catastrophic optical damage) level compared to an ordinary semiconductor optical amplifier using a single mode waveguide.

Furthermore, in the semiconductor optical amplifier 20 according to the present embodiment, its output mode can be controlled independently by the single mode waveguide 1, and structurally no odd modes are excited. Accordingly, the spatial hole burning is not easily caused compared to the conventional semiconductor optical amplifier utilizing the multi-mode waveguide having the flare structure. This enables to realize a semiconductor optical amplifier having an excellent mode stability.

In addition to the aforementioned, the semiconductor optical amplifier according to the present embodiment uses the multi-mode waveguides 2 and 4 performing the MMI. operation and accordingly, no mode conversion loss is generated in principle. Accordingly, the semiconductor laser according to the present embodiment does not cause efficiency lowering as is observed in the conventional semiconductor laser utilizing the flare structure.

Furthermore, the semiconductor optical amplifier according to the present embodiment has such a structure that the tapered waveguide 3 is inserted between the single mode waveguide 1 and the first multi-mode waveguide 2. Accordingly, it is possible to reduce the coupling loss (though very little) between the single mode waveguide 1 and the first multi-mode waveguide 2 almost to 0 dB.

It should be noted that in the present embodiment, although 20 the tapered waveguide 3 is implemented, the region of the waveguide 3 is very small. Accordingly, almost no mode conversion loss is caused and the mode stability can be maintained by the no odd mode pumping condition in the MMI. region.

Moreover, the tapered waveguide 3 widens the optical field at the light output end of the multi-mode waveguide 2. As a result, the coupling efficiency with the single mode optical fiber is improved.

Moreover, in the semiconductor optical amplifier according to the present embodiment, the light output end is constituted by a secondary mode cleaved waveguide (second multi-mode waveguide) 4 which is different from multi-mode waveguide 2 in which the light output end is the main pumping region. Accordingly, the tolerance for the cutting position is mitigated, facilitating a production procedure.

It should be noted that since the first multi-mode waveguide 2 is designed in such a manner that no odd modes are excited. Accordingly, even if the second multi-mode waveguide 4 is used as a waveguide of the output side, only the single mode is output without deteriorating the mode stability.

Moreover, the layered configuration of the semiconductor optical amplifier according to the present embodiment is equivalent to the layered configuration of an ordinary semiconductor optical amplifier. Accordingly, like the ninth embodiment, the semiconductor optical amplifier according to the present embodiment can be produced by the same production procedure of the ordinary semiconductor optical amplifier. That is, the semiconductor optical amplifier according to the present embodiment can be produced comparatively easily by using only an established production method, i.e., with a high repeatability and yield.

Moreover, since the semiconductor optical amplifier according to the present embodiment has a comparatively simple configuration, it can also be applied to an integrated optical device.

As has been described above, the semiconductor laser according to the present invention enables to obtain a high output and improve the COD level. Moreover, since the semiconductor laser according to the present invention has a simple configuration, it is possible to lower the tolerance in the production condition and to produce a semiconductor laser with a high repeatability.

Moreover, the semiconductor optical amplifier according to the present invention also has the aforementioned effects.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-132798 (Filed on May 13$^{th}$, 1999) including specification, claims, drawings and summary are incorporated herein by reference in its entirety.

What is claimed is:

1. A semiconductor laser comprising:
   an active light waveguide providing oscillated light;
   a single mode waveguide formed in said active light waveguide; and
   a multi-mode interference waveguide formed in said active light waveguide and having a light-incident end and a light output end having only one outlet;
   wherein the single mode waveguide provides a single mode of an oscillated light oscillated from said active light waveguide;
   wherein said single mode waveguide is connected to the light incident end of the multi-mode interference waveguide;
   wherein the multi-mode interference waveguide has a greater width than that of the single mode waveguide;
   wherein said multi-mode interference waveguide provides modes including a multi-mode oscillated light into said multi-mode interference waveguide; and
   wherein the semiconductor laser outputs light through said only one outlet of the light output end of the multi-mode interference waveguide.

2. A semiconductor laser as claimed in claim 1, wherein said semiconductor laser outputs single-mode light through said only one outlet of the light output end.

3. A semiconductor laser as claimed in claim 1, wherein a tapered waveguide is connected between the single mode waveguide and the multi-mode interference waveguide.

4. A semiconductor laser as claimed in claim 1, wherein the multi-mode interference waveguide has one port at one side and N-ports at the other side, where N is a positive integer.

5. A semiconductor laser as claimed in claim 1, wherein the multi-mode interference waveguide is a 1×1 multi-mode interference type waveguide.

6. A semiconductor laser comprising:
   an active light waveguide providing oscillated light;
   a single mode waveguide formed in said active light waveguide;
   a multi-mode interference waveguide, formed in said active light waveguide and having a light-incident end and a light output end having only one outlet; and
   an outlet multi-mode waveguide formed in said active waveguide having a light-incident end and a light output end having only one outlet;
   wherein the single mode waveguide provides a single mode of an oscillated light oscillated from said active light waveguide;
   wherein said single mode waveguide is connected to the light incident end of the multi-mode interference waveguide;
   wherein the multi-mode interference waveguide has a greater width than that of the single mode waveguide;
   wherein said multi-mode interference waveguide provide modes including a multi-mode oscillated light into said multi-mode interference waveguide;
   wherein said outlet multi-mode waveguide is connected to said multimode interference waveguide at said only one outlet of the light output end of the multi-mode interference waveguide; and
   wherein the semiconductor laser outputs light through said only one outlet of the light output end of the outlet multi-mode waveguide.

7. A semiconductor laser as claimed in claim 6, wherein the outlet multi-mode waveguide is a secondary mode cutoff waveguide.

8. A semiconductor laser as claimed in claim 6, wherein the outlet multi-mode waveguide is a 1×1 multi mode interference type waveguide.

9. A semiconductor optical amplifier comprising:
   an active light waveguide providing oscillated light;
   a single mode waveguide formed in said active light waveguide;
   a multi-mode interference waveguide formed in said active light waveguide and having a light incident end and a light output end having only one outlet; and
   an anti-reflection end formed on one end of said single mode waveguide and one end of the multi-mode interference waveguide;
   wherein the single mode waveguide provides a single mode of an oscillated light oscillated from said active light waveguide;
   wherein said single mode waveguide is connected to the light incident end of the multi-mode interference waveguide;
   wherein the multi-mode interference waveguide has a greater width than that of the single mode waveguide;
   wherein said multi-mode interference waveguide provides modes including a multi-mode oscillated light into said multi-mode interference waveguide; and
   wherein the semiconductor optical amplifier outputs light through said only one outlet of the light output end of the multi-mode interference waveguide.

10. A semiconductor optical amplifier as claimed in claim 9, wherein said semiconductor optical amplifier outputs single-mode light through said only one outlet of the light output end.

11. A semiconductor optical amplifier as claimed in claim 10, 1wherein a tapered waveguide is connected between the single mode waveguide and the multi-mode interference waveguide.

12. A semiconductor optical amplifier as claimed in claim 9, wherein the multi-mode interference waveguide is a 1×1 multi-mode interference type waveguide.

13. A semiconductor optical amplifier comprising:
   an active light waveguide providing oscillated light;
   a single mode waveguide formed in said active light waveguide;

a multi-mode interference waveguide formed in said active light waveguide layer and having a light incident end and a light output end having only one outlet;

an outlet multi-mode waveguide formed in said active waveguide having a light incident end and a light output end having only one outlet; and an anti-reflection end formed on one end of the single mode waveguide and one end of the outlet multi-mode waveguide;

wherein the single mode waveguide provides a single mode of an oscillated light oscillated from said active light waveguide;

wherein said single mode waveguide is connected to the light incident end of the multi-mode interference waveguide;

wherein the multi-mode interference waveguide has a greater width than that of the single mode waveguide;

wherein said multi-mode interference waveguide provides modes including a multi-mode oscillated light into said multi-mode interference waveguide;

wherein said outlet multi-mode waveguide is connected to said multi-mode interference waveguide at said only one outlet of the light output end of the multi-mode interference waveguide; and wherein the semiconductor optical amplifier outputs light through said only one outlet of the light out end of the outlet multi-mode waveguide.

14. A semiconductor optical amplifier as claimed in claim 13, wherein the outlet multi-mode waveguide is a secondary mode cut-off waveguide.

15. The semiconductor optical amplifier as claimed in claim 13, wherein the outlet multi-mode waveguide is a 1×1 multi-mode interference type waveguide.

* * * * *

UNITED STATES PATENT AND TRADEMARK OFFICE
CERTIFICATE OF CORRECTION

PATENT NO. : 6,768,758 B1
DATED : July 27, 2004
INVENTOR(S) : Hamamoto

It is certified that error appears in the above-identified patent and that said Letters Patent is hereby corrected as shown below:

Column 36,
Line 57, delete the number "1" before the word "wherein".

Signed and Sealed this

Eleventh Day of January, 2005

JON W. DUDAS
*Director of the United States Patent and Trademark Office*